US012224297B2

(12) United States Patent
Cheng et al.

(10) Patent No.: US 12,224,297 B2
(45) Date of Patent: Feb. 11, 2025

(54) METHOD OF FORMING AN IMAGE SENSOR HAVING STRESS RELEASING STRUCTURE

(71) Applicant: TAIWAN SEMICONDUCTOR MANUFACTURING COMPANY, LTD., Hsinchu (TW)

(72) Inventors: Yun-Wei Cheng, Hsinchu (TW); Chun-Wei Chia, Hsinchu (TW); Chun-Hao Chou, Hsinchu (TW); Kuo-Cheng Lee, Hsinchu (TW); Ying-Hao Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/156,693

(22) Filed: Jan. 19, 2023

(65) Prior Publication Data

US 2023/0163150 A1 May 25, 2023

Related U.S. Application Data

(60) Division of application No. 17/410,666, filed on Aug. 24, 2021, now Pat. No. 11,569,289, which is a
(Continued)

(51) Int. Cl.
*H01L 27/146* (2006.01)
*H01L 23/00* (2006.01)

(52) U.S. Cl.
CPC ...... *H01L 27/14634* (2013.01); *H01L 23/562* (2013.01); *H01L 27/14621* (2013.01);
(Continued)

(58) Field of Classification Search
CPC .............. H01L 27/14634; H01L 23/562; H01L 27/14621; H01L 27/1463; H01L 27/14636;
(Continued)

(56) References Cited

U.S. PATENT DOCUMENTS

2009/0108409 A1  4/2009  Tsutsue
2011/0260276 A1  10/2011 Ishibe et al.
(Continued)

FOREIGN PATENT DOCUMENTS

CN   101419948   4/2009
CN   108242450   7/2018
(Continued)

OTHER PUBLICATIONS

Office Action dated Mar. 21, 2021 for corresponding case No. KR 10-2019-0134548. (pp. 1-7).
(Continued)

*Primary Examiner* — Mohammed R Alam
(74) *Attorney, Agent, or Firm* — Hauptman Ham, LLP

(57) ABSTRACT

A method of making a semiconductor structure includes forming a pixel array region on a substrate. The method further includes forming a first seal ring region on the substrate, wherein the first seal ring region surrounds the pixel array region, and the first seal ring region includes a first seal ring. The method further includes forming a first isolation feature in the first seal ring region, wherein forming the first isolation feature includes filling a first opening with a dielectric material, wherein the first isolation feature is a continuous structure surrounding the pixel array region. The method further includes forming a second isolation feature between the first isolation feature and the pixel array region, wherein forming the second isolation feature includes filling a second opening with the dielectric material.

20 Claims, 35 Drawing Sheets

Related U.S. Application Data continuation of application No. 17/225,701, filed on Apr. 8, 2021, now Pat. No. 11,569,288, which is a continuation of application No. 16/591,891, filed on Oct. 3, 2019, now Pat. No. 10,985,199.

(60) Provisional application No. 62/753,242, filed on Oct. 31, 2018.

(52) U.S. Cl.
CPC .... H01L 27/1463 (2013.01); H01L 27/14636 (2013.01); H01L 27/1464 (2013.01); H01L 27/1469 (2013.01)

(58) Field of Classification Search
CPC ............ H01L 27/1464; H01L 27/1469; H01L 27/14641; H01L 27/14685; H01L 27/14687; H01L 27/14605; H01L 27/14609; H01L 27/14683
See application file for complete search history.

(56) References Cited

U.S. PATENT DOCUMENTS

| | | | |
|---|---|---|---|
| 2012/0175722 A1* | 7/2012 | Tai | H01L 27/1464 438/73 |
| 2016/0336369 A1 | 11/2016 | Tamaki et al. | |
| 2017/0243908 A1 | 8/2017 | Chien et al. | |
| 2018/0182808 A1 | 6/2018 | Kim et al. | |
| 2018/0219038 A1* | 8/2018 | Gambino | H01L 27/14618 |
| 2019/0131336 A1 | 5/2019 | Yoon et al. | |

FOREIGN PATENT DOCUMENTS

| | | |
|---|---|---|
| KR | 20140101273 | 8/2014 |
| KR | 20180042347 | 4/2018 |
| KR | 20180074159 | 7/2018 |
| TW | 201338525 A | 9/2013 |
| TW | 201411824 A | 3/2014 |

OTHER PUBLICATIONS

Office Action dated Dec. 17, 2021 for corresponding case No. CN 201911054417.5 (pp. 1-7).
Office Action dated Sep. 17, 2021 for corresponding case No. KR 10-2019-0134548 (pp. 1-6). English translation attached on p. 1.
Office Action dated Jun. 15, 2022 from corresponding application No. CN201911054417.5.

* cited by examiner

METHOD OF FORMING AN IMAGE SENSOR HAVING STRESS RELEASING STRUCTURE

PRIORITY CLAIM

The present application is a divisional of U.S. application Ser. No. 17/410,666, filed Aug. 24, 2021, now U.S. Pat. No. 11,569,289, issued Jan. 31, 2023, which is a continuation of U.S. application Ser. No. 17/225,701, filed Apr. 8, 2021, now U.S. Pat. No. 11,569,288, issued Jan. 31, 2023, which is a continuation of U.S. application Ser. No. 16/591,891, filed Oct. 3, 2019, now U.S. Pat. No. 10,985,199, issued Apr. 20, 2021, which claims the priority of U.S. Provisional Application No. 62/753,242, filed Oct. 31, 2018, which are incorporated herein by reference in their entireties.

BACKGROUND

Semiconductor image sensors are used for sensing light or radiation waves. Complementary metal-oxide-semiconductor (CMOS) image sensors (CIS) are widely used in various applications such as digital still camera or mobile phone camera applications. A CIS includes an array of pixels. Each of the pixels includes a photodiode which converts incident light into an electrical signal.

Backside illuminated (BSI) image sensors are CIS in which light enters from a back side, rather than a front side, of a semiconductor wafer. Because the back side of a BSI CMOS image sensor is relatively unobstructed by dielectric and/or metal layers formed on the front side of the semiconductor wafer in the CMOS processes, the overall sensitivity of the CMOS image sensor is improved.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
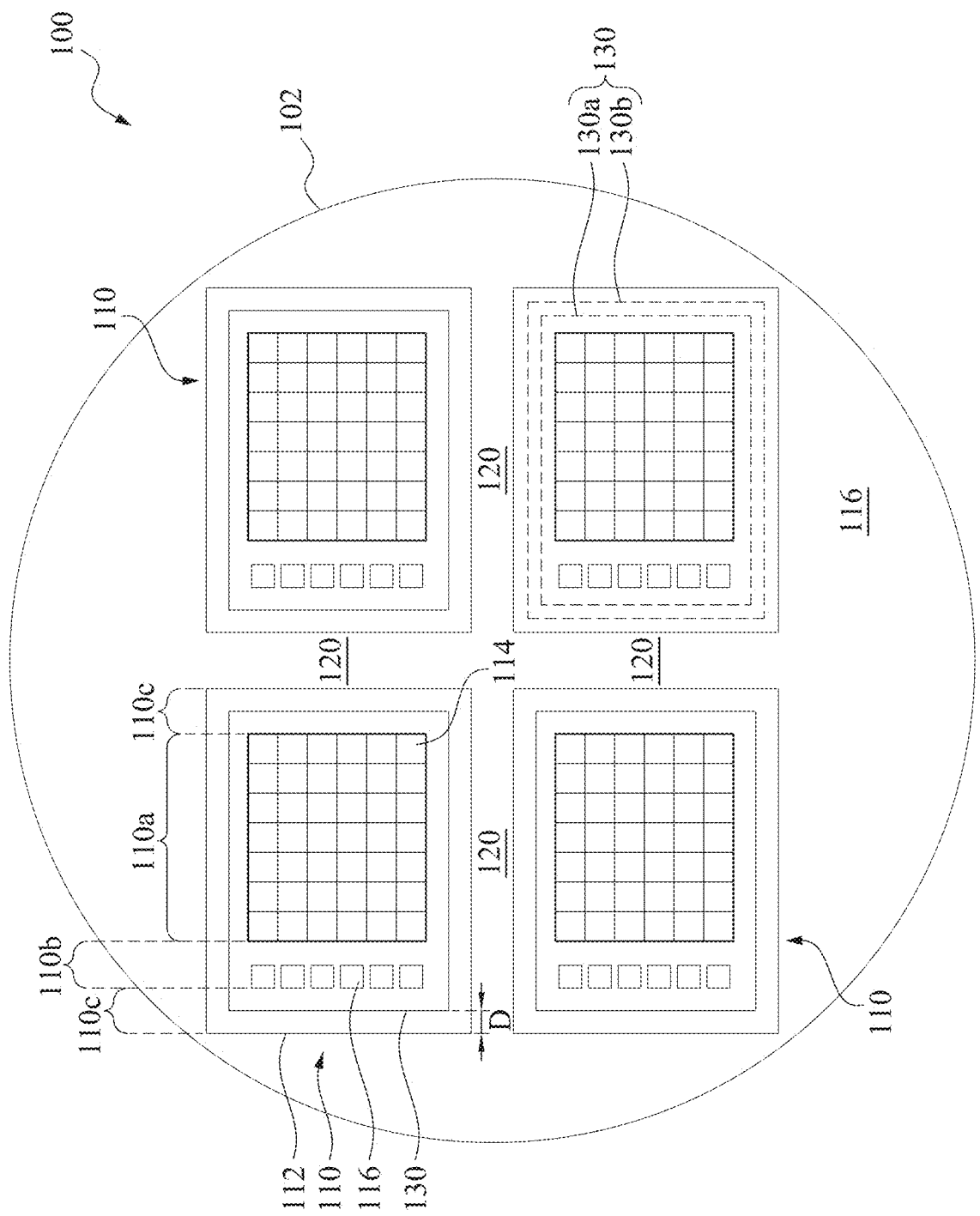
FIG. 1 is a top view of a wafer containing sensor chips having stress-releasing trench structures, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hundreds or in some cases thousands of semiconductor chips or dies (e.g., image sensor chips) are fabricated on a single semiconductor wafer. The individual dies are separated from each other by sawing along non-functional regions of the semiconductor wafer, known as scribe lines. A BSI image sensor includes a pixel array fabricated on a front side of a semiconductor wafer, but receives light through a back side of the semiconductor wafer. The back side of the semiconductor wafer is a side of the wafer opposite to an interconnect structure. During fabrication of a BSI image sensor, image sensor chips or dies are first fabricated on a sensor wafer, and after the necessary elements have been formed in or on the sensor wafer, the sensor wafer is bonded to a carrier wafer or a logic device wafer for further processing. The stacked wafer contains multiple stacked layers, which produce significant stress on the wafer. During the wafer dicing process, as a saw blade cuts through the wafer stack, stress in the wafer stack increases a risk of generating cracks at the die edges. Cracks generated at the edges have a risk of propagating into the active chip region, damaging the chip circuitry and reducing the reliability of the image sensor.

To help release the stress and thereby prevent or minimize the formation of cracks or limit propagation of cracks towards the active area of a chip during the die cut process, a stress-releasing trench structure is formed at a periphery region of each chip to surround an active circuit region of each chip. The stress-releasing trench structure includes a material different from the material of the substrate surrounding the stress-releasing trench structure, thereby helping to release the stress in the stacked wafer. The stress-releasing trench structure is formed at the bonding pad formation stage or at deep trench isolation (DTI) structure formation stage, thus formation of the stress-releasing trench structure is fully compatible with the CMOS fabrication process and requires no additional processes and masks.

FIG. 1 is a top view of a wafer 100 including sensor chips 110 having stress-releasing trench structures 130, in accordance with some embodiments. In some embodiments, the image sensor is a BSI CMOS image sensor. As in FIG. 1, the wafer 100 includes a plurality of sensor chips 110 on a substrate 102. In some embodiments, the sensor chips 110 are rectangular and are arranged in rows and columns. Scribe lines 120 extend between the sensor chips 110 and separate the sensor chips 110 from one another. For purpose of illustration, only four sensor chips 110 are included in FIG. 1 and are separated from each other by scribe lines 120. One of ordinary skill in the art would recognize that wafer 100 includes more than four sensor chips 110 in some embodiments. Singulation of the sensor chips 110 is affected by cutting the substrate 102 apart along the scribe lines 120.

Each of the sensor chips 110 includes a pixel array region 110a, a bonding pad region 110b, and a periphery region 110c surrounding the pixel array region 110a and the bonding pad region 110b. The pixel array region 110a includes an array of pixels 114 for sensing and recording an intensity of radiation (such as light) incident on the pixels 114. In some embodiments, each pixel 114 includes a photodiode capable of converting incident light into an electrical signal such as current or voltage, depending on mode of operation. The bonding pad region 110b includes a plurality of bonding pads 116 so that electrical connections between a sensor chip 110 and outside devices are possible. The pixel array region 110a and the bonding pad region 110b contain active circuit components, and together define an active circuit region of a sensor chip 110. The periphery region 110c is a region where non-active circuit components, such as seal rings, are located. A stress-releasing trench structure 130 is in the periphery region 110c around a perimeter of each sensor chip 110. The stress-releasing trench structure 130 includes a material different from a material of a substrate surrounding the stress-releasing trench structure 130, and thus is able to help reduce the stress in the wafer stack and to help prevent cracks from propagating into the active circuit region (110a, 110b) during the die cut process. As a result, the active devices in each sensor chip 110 are less likely to be damaged and the reliability of the image sensor is improved. In some embodiments, the stress-releasing trench structure 130 includes a dielectric material or an air gap. In some embodiments, the stress-releasing trench structure 130 is at the same location as the seal rings in the periphery region 110c. In some embodiments, the stress-releasing trench structure 130 is at a different location than the seal ring in the periphery region 110c. In some embodiments, the stress-releasing trench structure 130 abuts the chip edge 112. In some embodiments, the stress-releasing trench structure 130 is spaced from the chip edge 112. In some embodiments, a distance D between an outer-most sidewall of the stress-releasing trench structure 130 and the chip edge 112 is less than about 100 μm. If the distance D is too great, the usable area of the sensor chip 110 is wasted. If the distance D is too small, a risk of cutting the stress-releasing trench structure 130 during singulation increases. The stress-releasing trench structure 130 has a continuous or a non-continuous structure. In some embodiments, the stress-releasing trench structure 130 has a single continuous structure that completely surrounds the active circuit region (110a, 110b). In some embodiments, the stress-releasing trench structure 130 includes multiple non-continuous segments 130a and 130b that together completely surround the active circuit region (110a, 110b). In some embodiments, the stress-releasing trench structure 130 is the same for each sensor chip 110 on the wafer 100. In some embodiments, the stress-releasing structure 130 for at least one sensor chip 110 differs from a separate sensor chip 110 on the same wafer 100.

In some embodiments, the stress-releasing trench structure 130 includes inner non-continuous segments 130a and outer non-continuous segments 130b. The outer non-continuous segments 130b are staggered with respect to the inner non-continuous segments 130a such that the outer non-continuous segments 130b together with the inner non-continuous segments 130a completely surround the active circuit region (110a, 110b). In some embodiments, the distance between the inner non-continuous segments 130a and the outer non-continuous segments 130b is less than about 100 μm. If the distance is too great, the usable area of the sensor chip 110 is wasted.

Figure 2:
FIG. 2 is a flowchart of a method for fabricating a sensor chip having stress-releasing trench structures, in accordance with some embodiments.

FIG. 2 is a flow chart of a method 200 for fabricating a sensor chip on a wafer, e.g., wafer 100, having stress-releasing trench structures, i.e., stress-releasing trench structures 130, in accordance with some embodiments. FIGS. 3-12 are cross-sectional views of the sensor chip at various fabrication stages constructed according to the method 200 of FIG. 2. The method 200 is discussed in detail below, with reference to a sensor chip in FIGS. 3-12. In some embodiments, additional operations are performed before, during, and/or after the method 200, or some of the operations described are replaced and/or eliminated. In some embodiments, additional features are added to a sensor chip. In some embodiments, some of the features described below are replaced or eliminated. One of ordinary skill in the art would understand that although some embodiments are discussed with operations performed in a particular order, these operations may be performed in another logical order.

Figure 3:
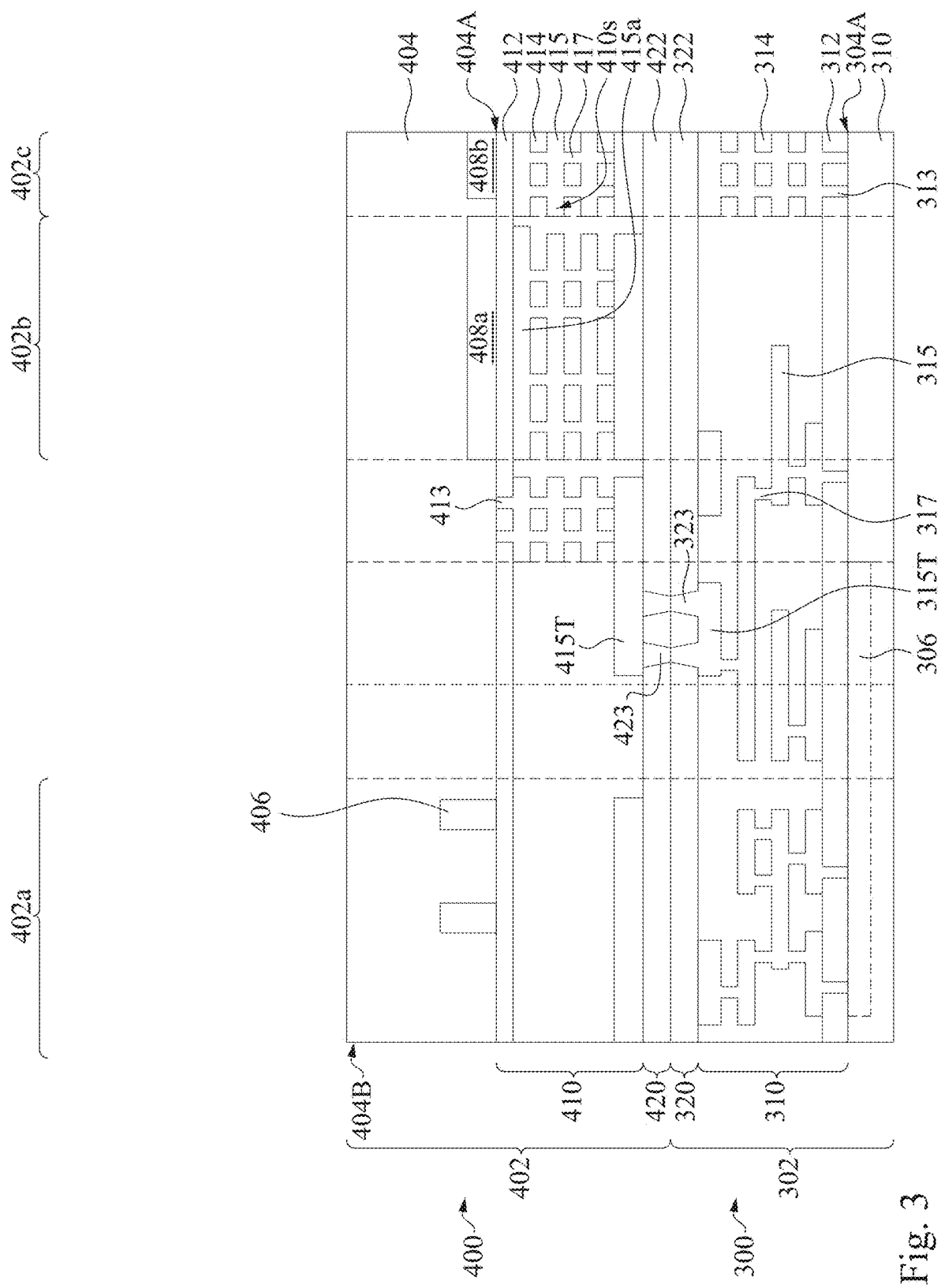
FIGS. 3-12 are cross-sectional views of a portion of a sensor chip having stress-releasing trench structures at various stages of fabrication, in accordance with some embodiments.

Referring to FIGS. 2 and 3, the method 200 includes operation 202, in which a sensor wafer 400 is bonded to a device wafer 300 to provide a wafer stack. FIG. 3 is a cross-sectional view of a semiconductor structure after bonding the sensor wafer 400 to the device wafer 300 to provide the wafer stack, in accordance with some embodiments.

Referring to FIG. 3, the device wafer 300 includes a plurality of device chips 302. For reasons of simplicity, a single device chip 302 is included in FIG. 3. In some embodiments, each device chip 302 is an Application Specific Integrated Circuit (ASIC) chip including electronic circuitry and electronic interconnections.

The device chips 302 are formed on and within a substrate 304. In some embodiments, the substrate 304 is a bulk semiconductor substrate including one or more semiconductor materials. In some embodiments, the substrate 304 includes an elemental semiconductor such as silicon or germanium, a III-V compound semiconductor such as gallium arsenide, gallium, phosphide, indium phosphide, indium arsenide, or indium antimonide, an alloy semiconductor such as silicon germanium, gallium arsenic phosphide, or gallium indium phosphide, or combinations thereof. In some embodiments, the substrate 304 includes a doped epitaxial layer, a gradient semiconductor layer, and/or a semiconductor layer overlying another semiconductor layer of a different type, such as a silicon layer on a silicon germanium layer. In some embodiments, the substrate 304 is a crystalline silicon substrate. In some embodiments, the substrate 304 is an active layer of a semiconductor-on-insulator (SOI) substrate. In some embodiments, the substrate 304 includes one or more doped regions. For example, the substrate 304 includes one or more p-doped regions, n-doped regions, or combinations thereof. Example p-type dopants in p-doped regions include, but are not limited to, boron, gallium, or indium. Example n-type dopants in n-doped regions include, but are not limited to, phosphors or arsenic.

Each device chip 302 includes a logic circuit 306 disposed at a front side 304A of the substrate 304. The logic circuit 306 includes various semiconductor devices, such as transistors, capacitors, inductors, or resistors, and is usable for controlling and/or operating the pixel array. For reasons of simplicity, the semiconductor devices formed in the logic circuit 306 are not specifically shown.

Each device chip 302 further includes an interconnect structure 310 over the front side 304A of the substrate 304. The interconnect structure 310 includes an inter-layer dielectric (ILD) layer 312 and metal contacts 313 in the ILD layer 312. The interconnect structure 310 further includes an inter-metal dielectric (IMD) layer 314 and one or more interconnect layers within the IMD layer 314. The metal interconnect layers comprise metal lines 315 and vias 317 stacked onto one another. In some embodiments, the ILD layer 312 includes a dielectric material, for example, silicon dioxide, silicon carbide, silicon nitride, or silicon oxynitride. The IMD layer 314 includes a low-k dielectric material having a dielectric constant less than 3.9. Example low-k dielectric materials include, but are not limited to, tetraethylorthosilicate (TEOS) oxide, undoped silicate glass, and doped silicate glass such as borophosphosilicate glass (BPSG), fluorosilica glass (FSG), phosphosilicate glass (PSG), or boron doped silicon glass (BSG). The IMD layer 314 is a single layer or a composite layer comprising a plurality of layers of a same material or different materials. The metal contacts 313, metal lines 315 and vias 317 independently include a conductive material, such as copper, aluminum, tungsten, cobalt, alloys thereof, or combinations thereof.

Each device chip 302 further includes a redistribution layer (RDL) 320 over the interconnect structure 310. The RDL 320 includes a dielectric layer 322 having redistribution structures 323, such as metal lines and/or vias, embedded therein. The dielectric layer 322 includes a dielectric material different from the dielectric material of the underlying IMD layer 314. In some embodiments, the dielectric layer 322 includes silicon dioxide. The redistribution structures 323 extend through the dielectric layer 322 and electrically connect to a topmost metal line 315T of the interconnect structure 310. The redistribution structures 323 include a conductive material, such as copper, aluminum, tungsten, alloys thereof, or combinations thereof.

The sensor wafer 400 includes a plurality of sensor chips 402. Each of the sensor chips 402 is stacked over a corresponding device chip 302. For reasons of simplicity, only a single sensor chip 402 stacked over a corresponding device chip 302 is included and described in FIG. 3. Each sensor chip 402 includes a pixel array region 402a, a bonding pad region 402b, and a periphery region 402c surrounding the pixel array region 402a and the bonding pad region 402b. The pixel array region 402a and bonding pad region 402b are in an active circuit region of each sensor chip 402.

The sensor chips 402 are on and within a substrate 404. In some embodiments, the substrate 404 is a crystalline silicon substrate or a semiconductor substrate formed of other semiconductor materials such as germanium silicon germanium, III-V compound semiconductors, or the like. The substrate 404 has a front side (also referred to as a front surface) 404A and a back side (also referred to as a back surface) 404B.

Each sensor chip 402 includes a plurality of photosensitive elements 406 in the front side 404A of the substrate 404. The photosensitive elements 406 correspond to pixels and are operable to sense radiation, such as an incident light that is projected toward the back side 404B of the substrate 404 and convert light signals (photons) to electrical signals. In some embodiments, the photosensitive elements 406 are photodiodes. In such embodiments, each of the photosensitive elements 406 includes a first region within the substrate 404 having a first doping type (e.g., n-type) and an adjoining second region within the substrate 404 having a second doping type (e.g., p-type) that is different from the first doping type. The photosensitive elements 406 are varied from one another to have different junction depths, thicknesses, and widths. For reasons of simplicity, only two photosensitive elements 406 are included in FIG. 3, and one of ordinary skill in the art would understand that any number of photosensitive elements 406 are implemented in the substrate 404. The photosensitive elements 406 are in the pixel array region 402a and are arranged in an array comprising rows and/or columns Each sensor chip 402 further includes a plurality of shallow trench isolation (STI) structures at the front side 404A of the substrate 404. In some embodiments, the plurality of STI structures includes a first STI structure 408a in the bonding pad region 402b and a second STI structure 408b in the periphery region 402c. In some embodiments, the pixel array region 402a also includes one or more STI structures to isolate the photosensitive elements 406 from one another. The STI structures extend from the front side 404A of the substrate 404 into the substrate 404. In some embodiments, the STI structures include one or more dielectric materials. In some embodiments, the STI structures include a dielectric oxide, for example, silicon dioxide. The STI structures are formed by etching openings into the substrate 404 from the front side 404A and thereafter filling the openings with the dielectric material(s).

Each sensor chip 402 further includes an interconnect structure 410 over the front side 404A of the substrate 404. The interconnect structure 410 includes an ILD layer 412 and metal contacts 413 in the ILD layer 412. The interconnect structure 410 further includes an IMD layer 414 and one or more metal interconnect layers in the IMD layer 414. The metal interconnect layers comprise alternating metal lines 415 and vias 417 stacked onto one another. In some embodiments, the ILD layer 412 includes a dielectric material, for example, silicon dioxide, silicon carbide, silicon nitride, or silicon oxynitride. The IMD layer 414 includes a low-k dielectric material having a dielectric constant less than 3.9. In some embodiments, the IMD layer 414 includes TEOS oxide, undoped silicate glass, or doped silicate glass such as BPSG, FSG, PSG, or BSG. The IMD layer 414 is a single layer or a composite layer comprising a plurality of layers of a same material or different materials. The metal contacts 413, metal lines 415 and vias 417 independently include a conductive material, such as copper, aluminum, tungsten, cobalt, alloys thereof, or combinations thereof.

A portion of the interconnect structure 410 in the periphery region 402c functions as a seal ring 410s. The seal rings 410s in the sensor wafer 400 help to prevent moisture and detrimental chemicals from penetrating into sensor chips 402 and reaching the devices and interconnect structures located in the active circuit region (402a, 402b).

Each sensor chip 402 further includes a redistribution layer (RDL) 420 over the interconnect structure 410. The RDL 420 includes a dielectric layer 422 having redistribution structures 423, such as metal lines and/or vias, embedded therein. The dielectric layer 422 includes dielectric material different from the dielectric material of the underlying IMD layer 414. In some embodiments, the dielectric layer 422 includes silicon dioxide. The redistribution structures 423 extend through the dielectric layer 422 and electrically connect to a topmost metal line 415T of the interconnect structure 410. The redistribution structures 423 include a conductive material, such as copper, aluminum, tungsten, alloys thereof, or combinations thereof.

The sensor wafer 400 is flipped and is stacked onto the device wafer 300 in a face-to-face configuration such that the RDL 420 in each sensor chip 402 is aligned with the RDL 320 in each device chip 302. The sensor wafer 400 and the device wafer 300 are bonded together through a direct bonding process. In some embodiments, the direct bond process is implemented using a metal-to-metal bond, a dielectric-to-dielectric bond, or a hybrid bond including a metal-to-metal bond and a dielectric-to-dielectric bond. For example, the metal-to-metal bond is implemented between the redistribution structures 323 and the redistribution structures 423 such that after bonding, the redistribution structures 323 in the RDL 320 and the corresponding redistribution structures 423 in the RDL 420 are in direct contact with each other. In some embodiments, the metal-to-metal bond is a copper-to-copper bond. The dielectric-to-dielectric bond is implemented between the dielectric layer 322 and the dielectric layer 422 such that after bonding, the dielectric layer 322 and the dielectric layer 422 are in direct contact with each other. In some embodiments, the dielectric-to-dielectric bond is an oxide-to-oxide bond. In some embodiments, a different bonding process is used, for example bonding using solder bumps or copper pillars.

After the sensor wafer 400 is bonded to the device wafer 300, a thinning process is performed to thin the substrate 404 from the back side 404B, such that light is able to more easily pass through the substrate 404 and contact the photosensitive elements 406 without being absorbed by the substrate 404. The thinning process includes mechanical grinding, chemical mechanical polishing (CMP), etching, or combinations thereof. In some embodiments, a substantial amount of substrate material is first removed from the substrate 404 by mechanical grinding. Afterwards, a wet etch is performed to further thin the substrate 404 to a thickness that is transparent to the incident light. After the thinning process, the substrate 404 has a thickness from about 1 µm to about 5 µm. If the thickness of the substrate 404 following the thinning process is too great, incident light will be absorbed and not reach the photosensitive elements 406, in some instances. If the thickness of the substrate 404 following the thinning process is too thin then subsequent processing of substrate 404 increases a risk of damage to the photosensitive elements 406, in some instances.

Figure 4:
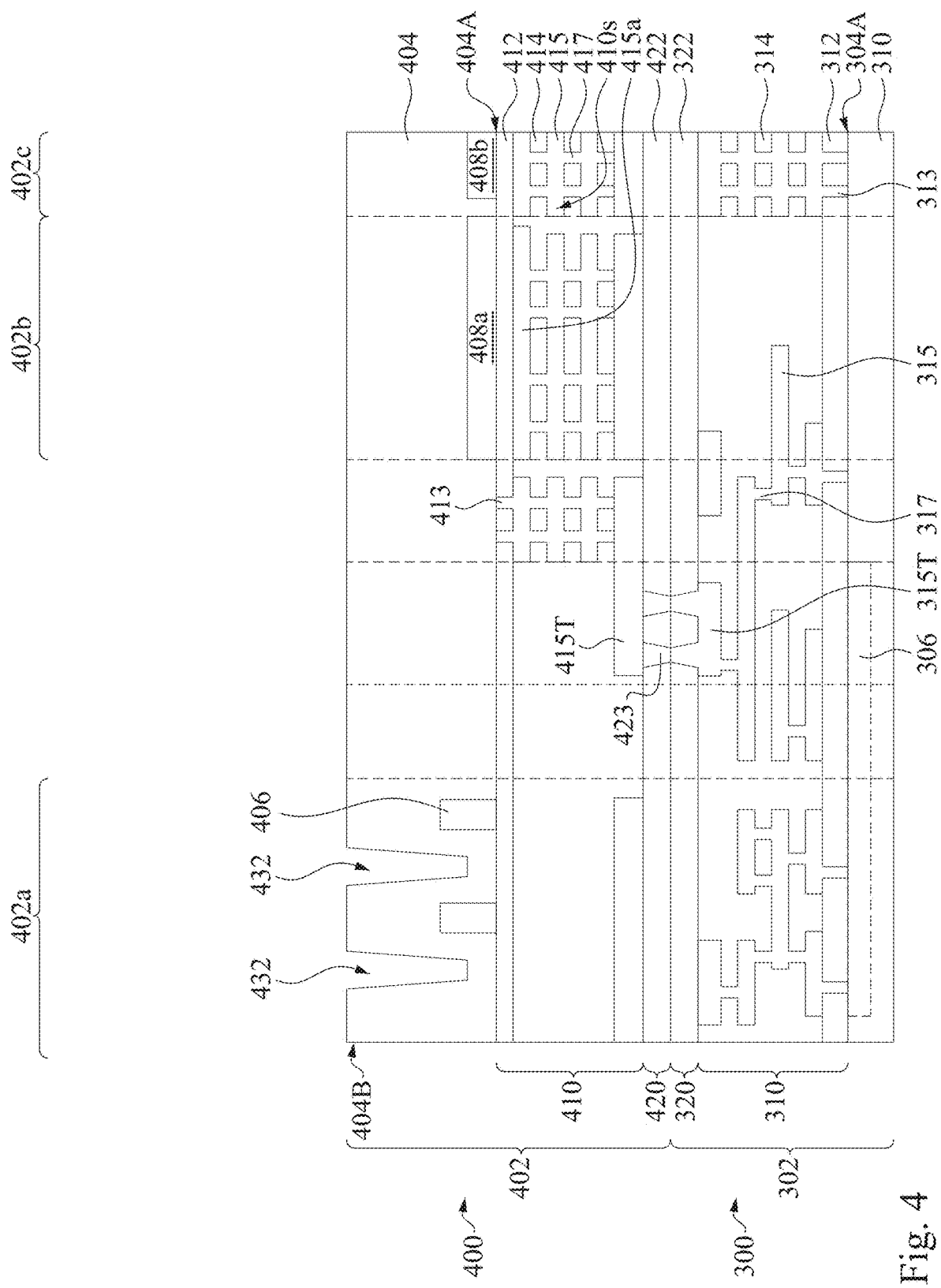

Referring to FIGS. 2 and 4, the method 200 proceeds to operation 204, in which the substrate 404 is selectively etched from the back side 404B to form deep trenches 432 within the substrate 404 in the pixel array region 402a. FIG. 4 is a cross-sectional view of the semiconductor structure of FIG. 3 after etching the deep trenches 432 within the back side 404B of the substrate 404 in the pixel array region 402a.

Referring to FIG. 4, the deep trenches 432 extend from the back side surface of the substrate 404 into the substrate 404. The deep trenches 432 separate the photosensitive elements 406 from one another such that deep trench isolation (DTI) structures 434 (FIG. 5) subsequently formed therein are capable of reducing crosstalk and interference between adjacent photosensitive elements 406. As used herein, deep trenches are trenches having aspect ratio (i.e., depth/width ratio) greater than about 5. In some embodiments, the deep trenches 432 have a depth from about 0.5 µm to about 2 µm and a width equal to or less than about 0.25 µm. If the depth and width of the deep trenches 432 is too small, a risk of cross-talk between pixels increases in some instances. If the depth of the deep trenches 432 is too great, then filling the deep trenches 432 becomes more difficult. If the width of the deep trenches 432 is too great, a risk of the trench blocking incident light increases in some embodiments. In some embodiments, a cross-section of at least one deep trench 432 has a trapezoidal shape with inclined sidewalls. In such configuration, a width of at least one the deep trench 432 decreases as a distance from the back side 404B of the substrate 404 increases. In some embodiments, a cross-section of at least one deep trench 432 has a rectangular shape with substantially vertical sidewalls.

The deep trenches 432 are formed by lithography and etching processes. In some embodiments, a photoresist layer (not shown) is first applied over the back side 404B of the substrate 404 by spin coating. The photoresist layer is then patterned using a photolithography process that involves exposure, baking, and developing of the photoresist to form a patterned photoresist layer having openings therein. The openings expose portions of the substrate 404 where the deep trenches 432 are subsequently formed. The openings in the patterned photoresist layer are transferred into the substrate 404 to form the deep trenches 432, for example by using an anisotropic etch. In some embodiments, the anisotropic etch includes a dry etch such as, for example, reactive ion etch (RIE) or a plasma etch, a wet etch, or a combination thereof. After formation of deep trenches 432, the patterned photoresist layer is removed, for example, by wet stripping or plasma ashing. Alternatively, in some embodiments, a hard mask layer comprising a nitride (e.g., silicon nitride) is used such that the trench pattern is transferred from the patterned photoresist layer to the hard mask layer by a first anisotropic etch and then transferred to the substrate 404 by a second anisotropic etch.

Figure 5:
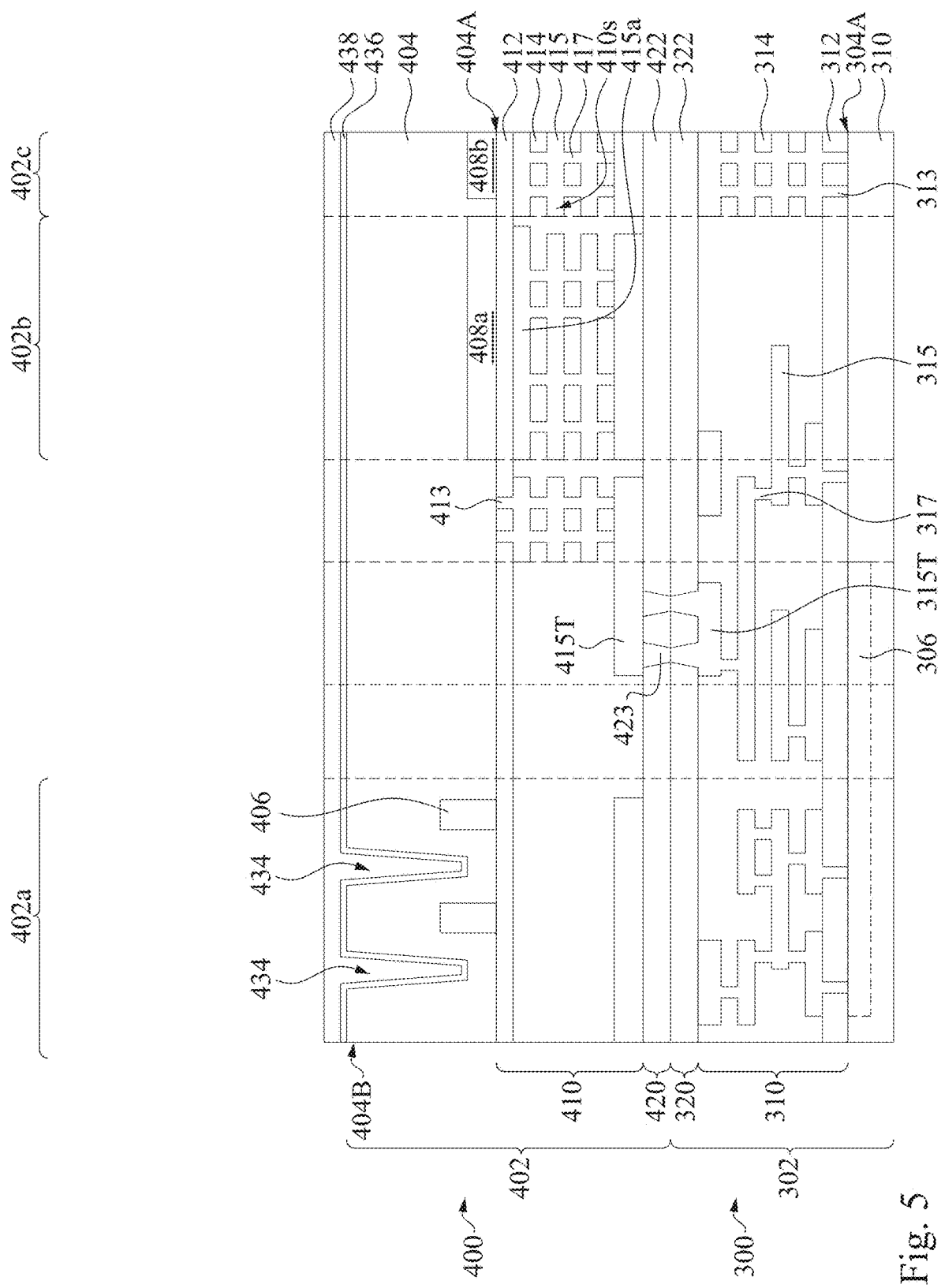

Referring to FIGS. 2 and 5, the method 200 proceeds to operation 206, in which DTI structures 434 are formed within the deep trenches 432 by depositing a dielectric liner layer 436 along sidewalls and bottom surfaces of the deep trenches 432 followed by depositing a dielectric fill layer 438 over the dielectric liner layer 436 to fill the deep trenches 432. FIG. 5 is a cross-sectional view of the semiconductor structure of FIG. 4 after forming the DTI structures 434 within the deep trenches 432, in accordance with some embodiments.

Referring to FIG. 5, the dielectric liner layer 436 is first deposited along sidewalls and bottom surfaces of the deep trenches 432 and over the back side surface of the substrate 404. The dielectric liner layer 436 has a single layer or a multi-layer structure. In some embodiments, the dielectric liner layer 436 includes one or more high-k dielectric material having a dielectric constant greater than 3.9. Example high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide (LaAlO$_3$), and yttrium oxide (Y$_2$O$_3$). In some embodiments, the dielectric liner layer 436 includes a bilayer of Al$_2$O$_3$ and Ta$_2$O$_5$ In some embodiments, the dielectric liner layer 436 is deposited utilizing a conformal deposition process such as, for example, chemical vapor deposition (CVD), plasma enhance chemical vapor deposition (PECVD), or atomic layer deposition (ALD).

The dielectric fill layer 438 is then deposited over the dielectric liner layer 436 to fill the deep trenches 432. In some embodiments, due to the high aspect ratio of the deep trenches 432, the deposition of the dielectric fill layer 438 results in voids or seams in the interior of the deep trenches 432. In some embodiments, the dielectric fill layer 438 includes a dielectric material having a good gap filling characteristic. In some embodiments, the dielectric fill layer 438 includes a dielectric oxide such as silicon dioxide, a dielectric nitride such as silicon nitride, or a dielectric carbide such as silicon carbide. In some embodiments, the dielectric fill layer 438 is deposited by a deposition process such as CVD, PECVD, or physical vapor deposition (PVD). In some embodiments, a planarization process such as, for example, CMP is performed after the forming the dielectric fill layer 438 to provide a planar surface. After the planarization, the planar surface of the dielectric fill layer 438 is above the back side surface of the substrate 404.

Portions of the dielectric liner layer 436 on sidewalls and bottom surfaces of the deep trenches 432 and portions of a dielectric fill layer 438 within the deep trenches 432 constitute the DTI structures 434. The DTI structures 434 separate adjacent photosensitive elements 406 from one another, thereby helping to reduce crosstalk and interference between adjacent photosensitive elements 406. In some embodiments, the DTI structures 434 contains void or seam.

Figure 6:
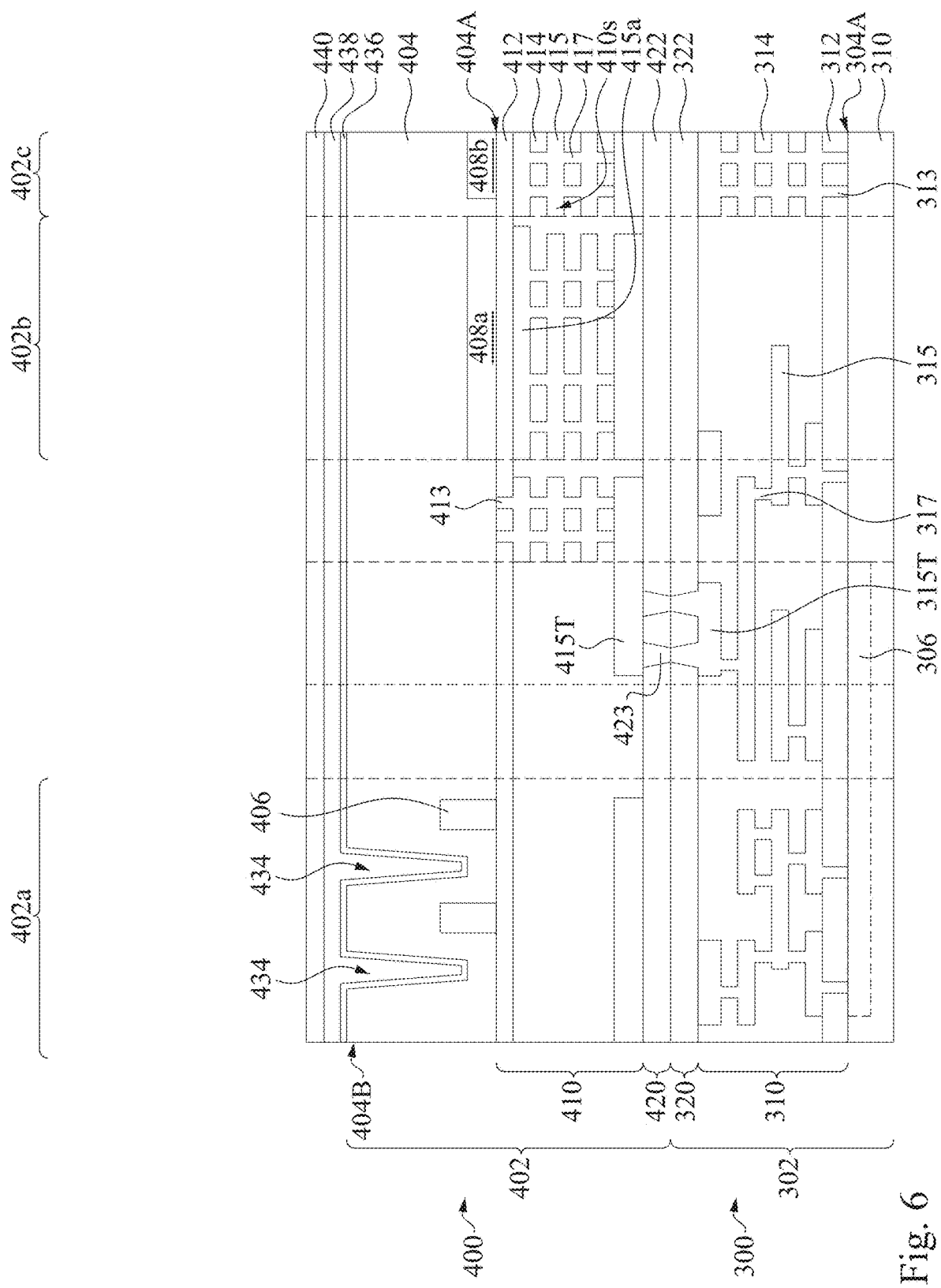

Referring to FIGS. 2 and 6, the method 200 proceeds to operation 208, in which a hard mask layer 440 is deposited over the back side 404B of the substrate 404. FIG. 6 is a cross-sectional view of the semiconductor structure of FIG. 5 after depositing the hard mask layer 440 over the back side 404B of the substrate 404, in accordance with some embodiments.

In some embodiments, the hard mask layer 440 is in direct contact with the dielectric fill layer 438. In some embodiments, the hard mask layer 440 includes a dielectric nitride such as silicon nitride. In some embodiments, the hard mask layer 440 is deposited by, for example, CVD, PVD, or PECVD.

Figure 7:
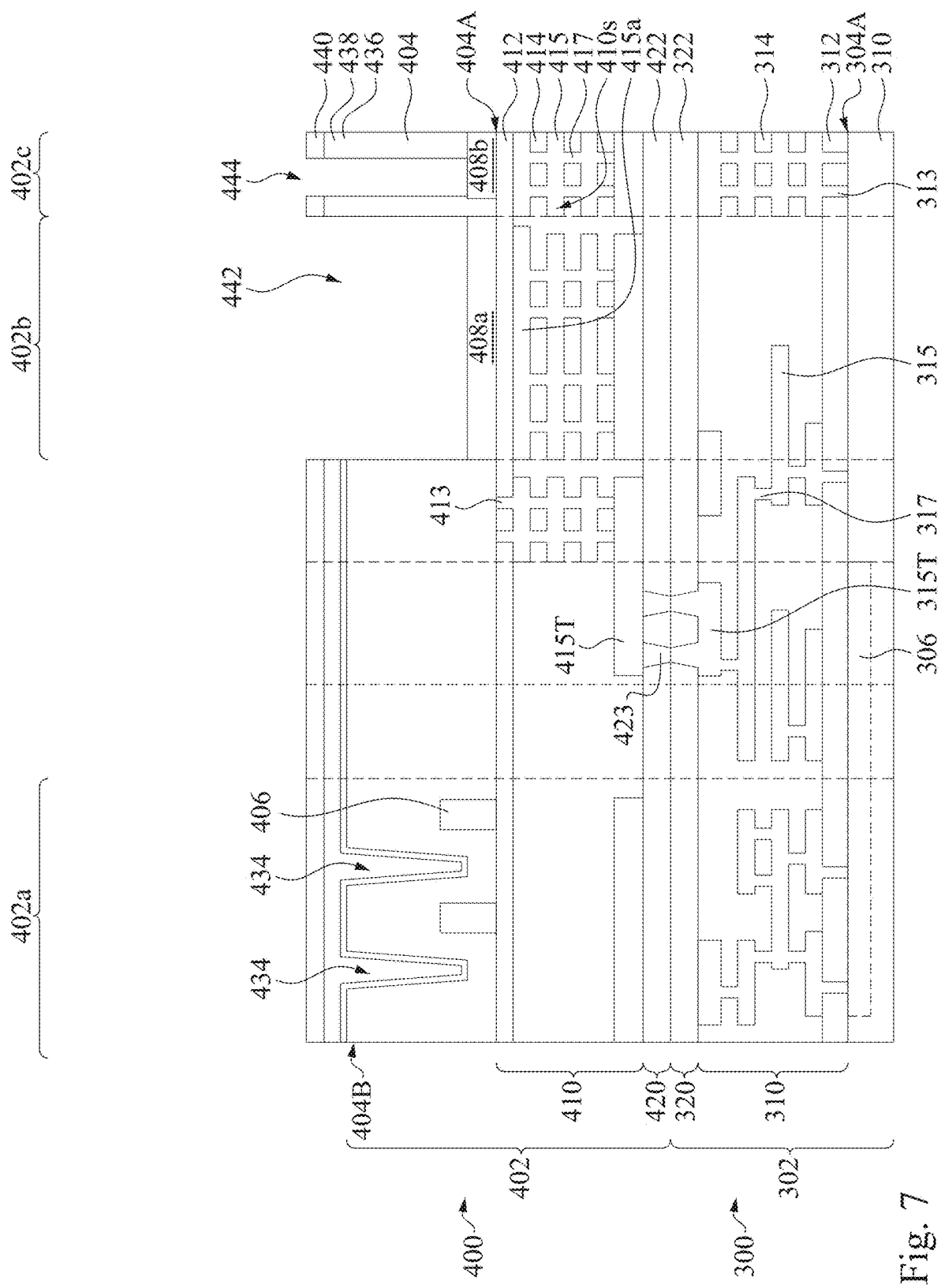

Referring to FIGS. 2 and 7, the method 200 proceeds to operation 210, in which the bonding pad region 402b and the periphery region 402c are opened to form a plurality of pad openings 442 in the bonding pad region 402b and a trench 444 in the periphery region 402c of each sensor chip 402. FIG. 7 is a cross-sectional view of the semiconductor structure of FIG. 6 after forming the plurality of pad openings 442 in the bonding pad region 402b and the trench 444 in the periphery region 402c of each sensor chip 402, in accordance with some embodiments.

The pad openings 442 in the bonding pad region 402b extend through the hard mask layer 440, the trench fill layer 438, the dielectric liner layer 436 and the substrate 404 to expose the first STI structure 408a in the bonding pad region 402b.

The trench 444 in the periphery region 402c extends through the hard mask layer 440, the dielectric fill layer 438, the dielectric liner layer 436 and the substrate 404 to expose the second STI structure 408b in the periphery region 404c. In some embodiments, the trench 444 has a continuous structure that completely surrounds the active circuit region (402a, 402b) of each sensor chip 402. In some embodiments, the trench 444 includes multiple trench segments that are arranged along the perimeter of the active circuit region (402a, 402b) and together completely surround the active circuit region (402a, 402b) of each sensor chip 402. In some embodiments, a distance between opposite ends of adjacent trench segments is less than about 100 μm. Although the trench 444 in FIG. 7 is above the seal ring 410s, in some embodiments, the trench 444 is in a location of the periphery region 402c that does not contain the seal ring 410s.

The pad openings 442 and trench 444 are formed by lithography and etching processes. In some embodiments, a photoresist layer (not shown) is first applied over the hard mask layer 440 for example, by spin coating. The photoresist layer is then patterned using a photolithography process that involves exposure, baking, and developing of the photoresist to form a patterned photoresist layer having openings therein. The openings expose areas of the substrate 404 where the pad openings 442 and trench 444 are subsequently formed. The openings in the patterned photoresist layer are then transferred into the hard mask layer 440, the dielectric fill layer 438, the dielectric liner layer 436, and the substrate 404 to form the pad openings 442 and trench 444 by at least one anisotropic etch. In some embodiments, the at least one anisotropic etch includes a dry etch such as, for example, RIE or a plasma etch, a wet etch, or combinations thereof. The at least one anisotropic etch removes portions of the hard mask layer 440, the dielectric fill layer 438, the dielectric liner layer 436, and the substrate 404 in the bonding pad region 402b and the periphery region until the STI structures 408a and 408b are exposed. In some embodiments, the hard mask layer 440, the dielectric fill layer 438, the dielectric liner layer 436, and the substrate 404 are etched by a single anisotropic etch. In some embodiments, the hard mask layer 440, the dielectric fill layer 438, the dielectric liner layer 436, and the substrate 404 are etched by multiple anisotropic etches. After formation of the pad openings 442 and trench 444, the patterned photoresist layer is removed, for example, by wet stripping or plasma ashing. In some embodiments, the lithography and etching processes employed in formation of pad openings 442 and trench 444 also form scribe lines in the substrate 404 between adjacent sensor chips 402. In some embodiments, pad openings 442 and trench 444 are formed simultaneously. In some embodiments, pad openings 442 and trench 444 are formed sequentially.

In some embodiments, a cross-section of at least one of the pad openings 442 and the trench 444 is formed to have a rectangular shape with substantially vertical side walls. In other embodiments, a cross-section of at least one of the pad openings 442 and the trench 444 is formed to have a trapezoid shape with inclined sidewalls. In some embodiments, at least one of the pad openings 442 and the trench 444 is formed to have a width decreasing as the distance from the hard mask layer 440 increases. In some embodiments, the trench 444 is formed to have inclined sidewalls with a wider width at the top and a narrower width at the bottom. In some embodiments, the difference between a width of the trench 444 at the top and a width of the trench 444 at the bottom is from about 0.01 μm to about 10 μm.

Figure 8:
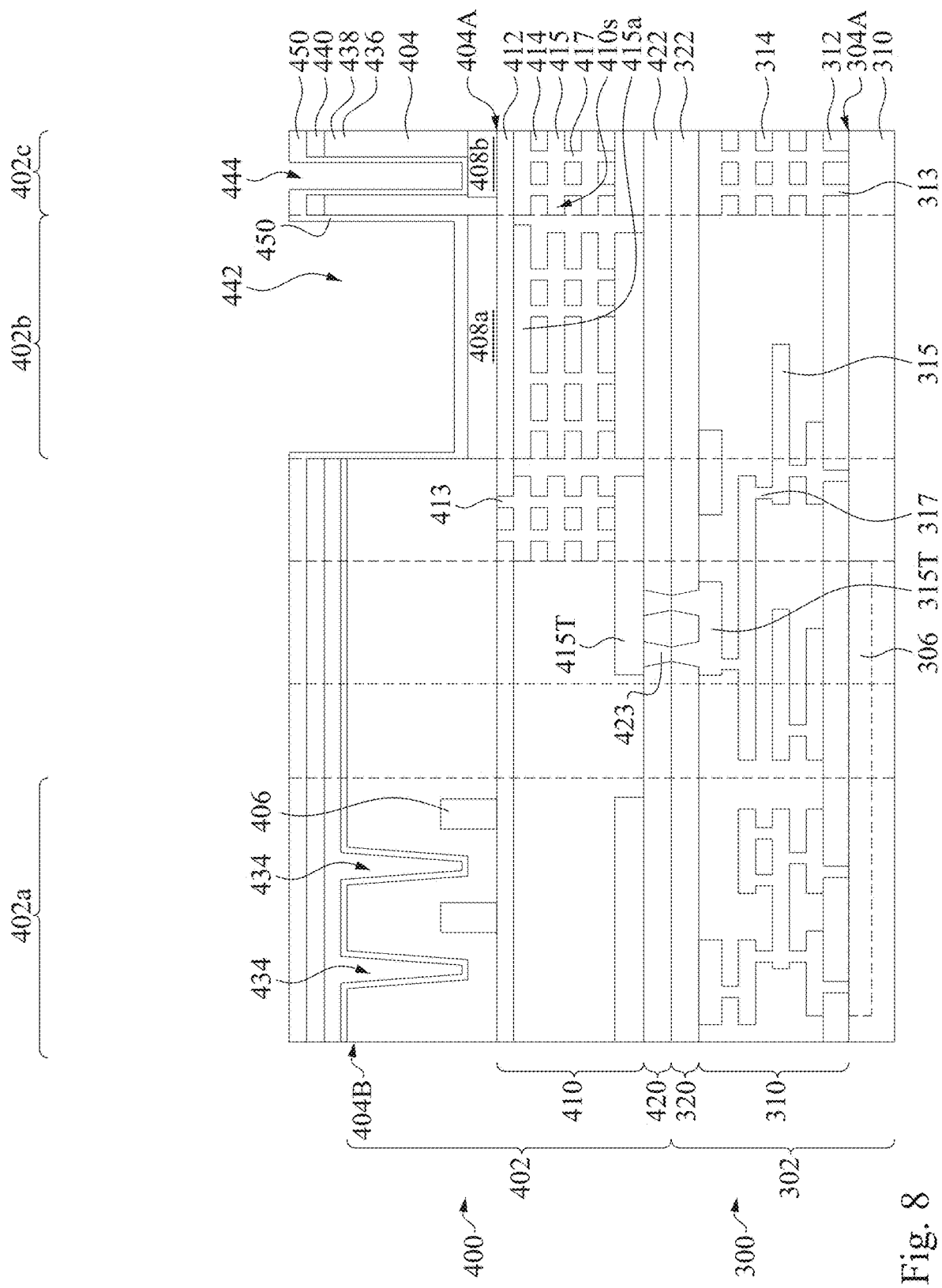

Referring to FIGS. 2 and 8, the method 200 proceeds to operation 212, in which a passivation layer 450 is deposited along sidewalls and bottom surfaces of the pad openings 442 and trench 444 of each sensor chip 402 and over the hard mask layer 440. FIG. 8 is a cross-sectional view of the semiconductor structure of FIG. 7 after depositing the passivation layer 450 along sidewalls and bottom surfaces of the pad openings 442 and trench 444 of each sensor chip 402 and over the hard mask layer 440, in accordance with some embodiments.

The passivation layer 450 is deposited over the top surface of the hard mask layer 440 and over top surfaces of the STI structures 408a, 408b and sidewall surfaces of the substrate 404 that are exposed by pad openings 442 and trench 444. In some embodiments, the passivation layer 450 includes a dielectric oxide such as, for example, silicon dioxide. In some embodiments, the passivation layer 450 is deposited by a conformal deposition process such as, for example, CVD or ALD.

Figure 9:
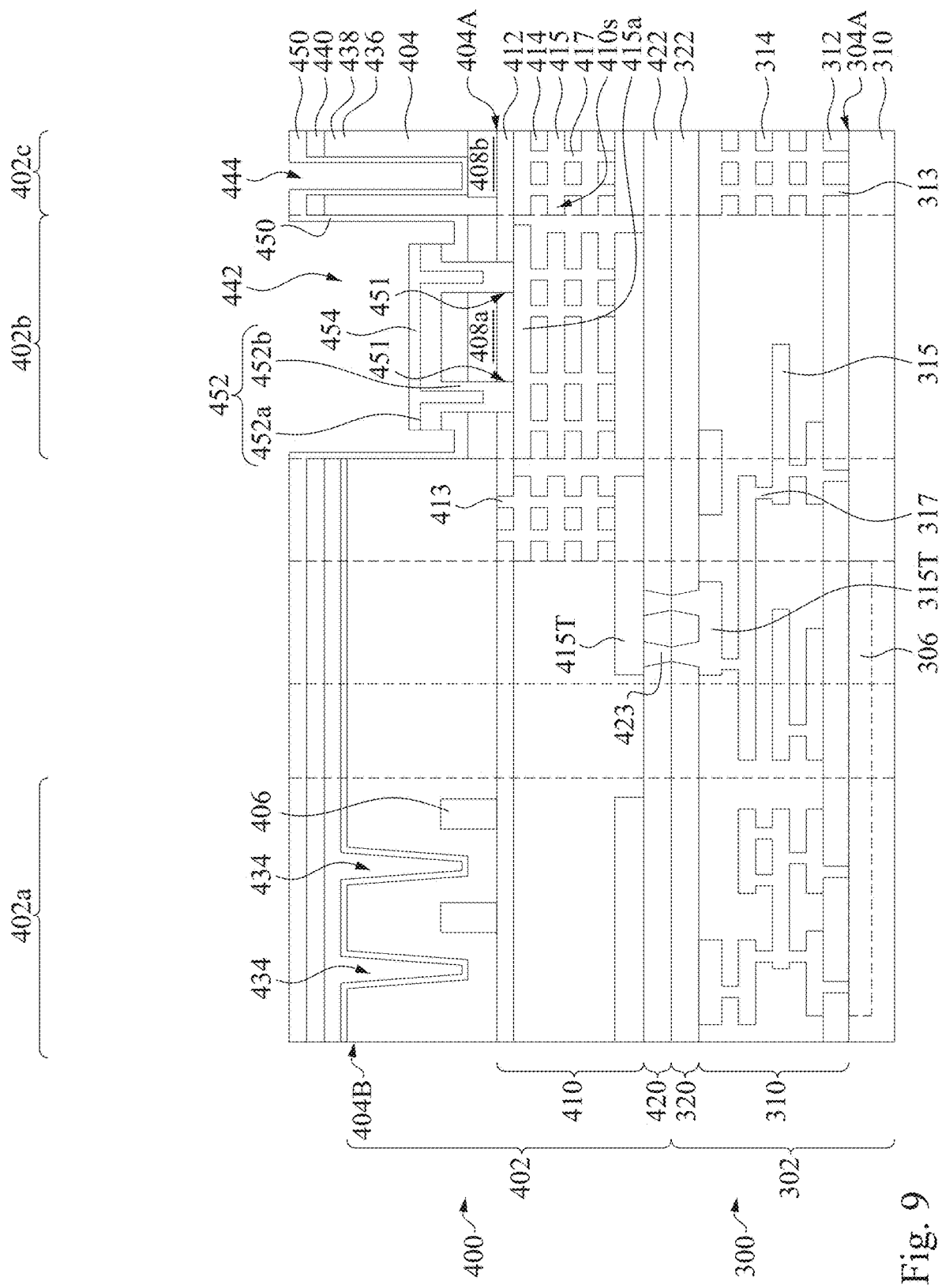

Referring to FIGS. 2 and 9, the method 200 proceeds to operation 214, in which a plurality of bonding pads 452 is formed in the bonding pad region 402b of each sensor chip 402 and a dielectric cap 454 is formed over each bonding pad 452. FIG. 9 is a cross-sectional view of the semiconductor structure of FIG. 8 after forming the plurality of bonding pads 452 in the bonding pad region 402b of each sensor chip 402 and forming a dielectric cap 454 over each bonding pad 452, in accordance with some embodiments.

The bonding pads 452 are formed within respective pad openings 442 at a position overlying the passivation layer 450. Each bonding pad 452 extends through the passivation layer 450, the first STI structure 408a, and the ILD layer 412 to electrically couple to a metal line 415a in the interconnect structure 410. In some embodiments, the metal line 415a is a closest metal line to the substrate 404. In other embodiments, the metal line 415a is separated from the substrate 404 by one or more conductive wires (not shown). In some embodiments, each bonding pad 452 has a slotted structure including base portions 452a overlying a portion of the passivation layer 450 at the bottom of the corresponding pad opening 442 and protrusions 452b along sidewalls and bottoms surfaces of openings 451 extending through the passivation layer 450, the first STI structure 408a, and the ILD layer 412. Each bonding pad 452 includes a conductive material such as, for example, aluminum, copper, tungsten, alloy thereof, or combinations thereof.

The dielectric cap 454 is over a bonding pad 452 to fill remaining volumes of the openings 451. In some embodiments, the dielectric cap 454 includes an oxynitride such as, for example, silicon oxynitride. In some embodiments, sidewalls of the dielectric cap 454 are vertically aligned with sidewalls of the base portions 452a of a bonding pad 452.

The bonding pads 452 and the dielectric caps 454 are formed by first etching the passivation layer 450, the first STI structure 408a, and the ILD layer 412 to form openings 451. The openings 451 extend through the passivation layer 450, the first STI structure 408a and the ILD layer 412, exposing the metal line 415a. In some embodiments, the openings 451 are formed using lithography and etching processes including applying a photoresist layer to the passivation layer 450, patterning the photoresist layer, etching the passivation layer 450, the STI structure 408a and the ILD layer 412 using the patterned photoresist layer as a mask, and then stripping the patterned photoresist layer. After forming the openings 451, a pad metal layer is formed along sidewall and bottom surfaces of openings 451 and over the passivation layer 450. In some embodiments, the pad metal layer is formed using a conformal deposition process such as, for example, CVD, PVD, electroless plating, or electroplating. A dielectric cap layer is then deposited over the pad metal layer to fill openings 451. In some embodiments, the dielectric cap layer is deposited by, for example, CVD, PVD, or PECVD. The dielectric cap layer and the pad metal layer are subsequently etched to remove portions of the dielectric cap layer and the pad metal layer not in the bonding pad region 402b. In some embodiments, a single etch is performed to remove the unwanted portions of the dielectric cap layer and the pad metal layer. In some embodiments, multiple etches are performed to sequentially remove the unwanted portions of the dielectric cap layer and the pad metal layer. Each etch is a dry etch such as RIE or a wet etch. The remaining portion of the pad metal layer within the pad openings 442 constitutes the bonding pads 452. The remaining portion of the dielectric cap layer within the pad openings 442 constitutes the dielectric caps 454. In some embodiments, the etching process employed to etch the dielectric cap layer and the pad metal layer also removes portions of the passivation layer 450 within the pad openings 442 that are adjacent to the sidewalls of the pad openings 442. Therefore, after etching, portions of the passivation layer 450 within the pad openings 442 have a stepped shape.

Figure 10:
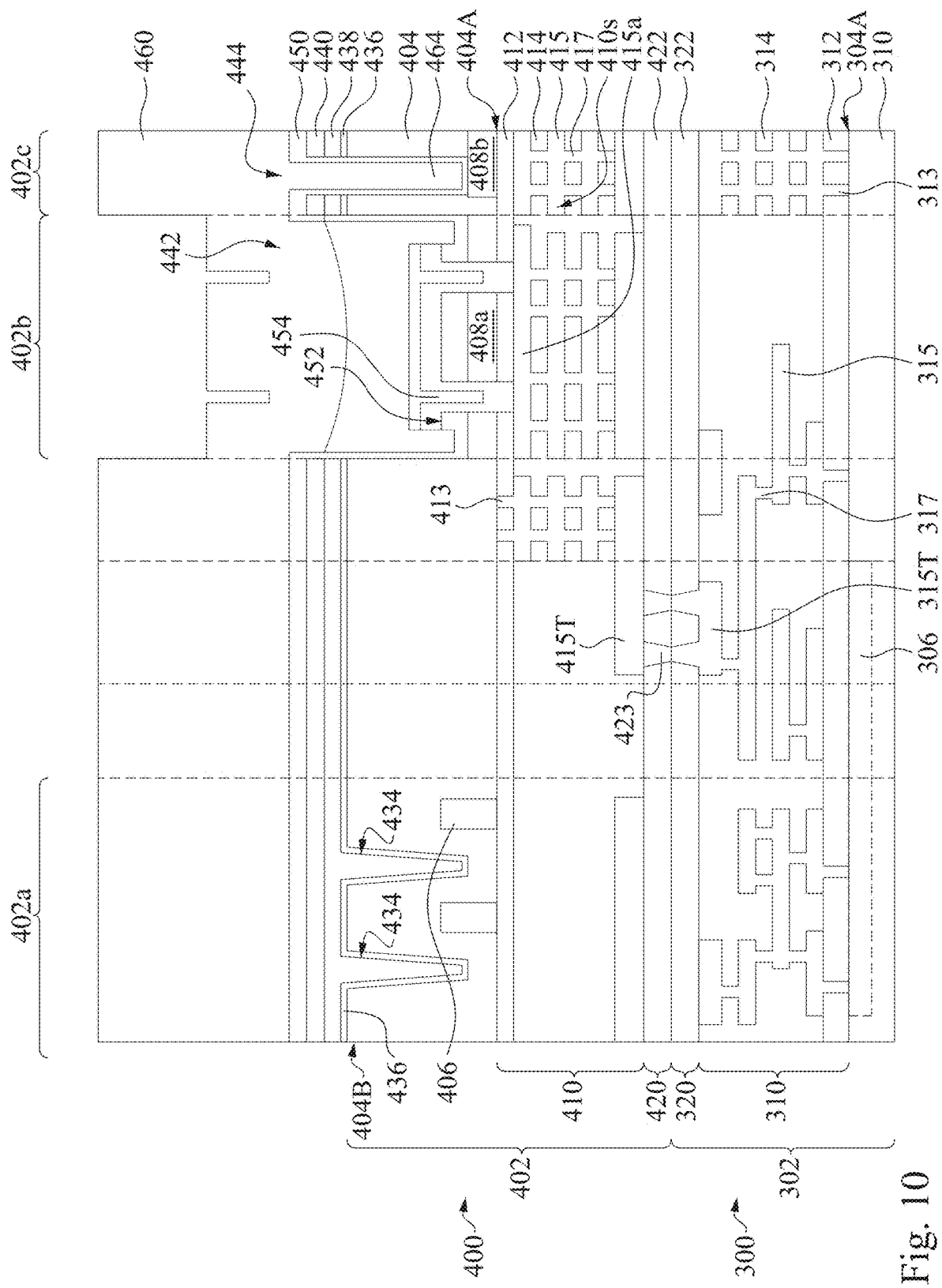

Referring to FIGS. 2 and 10, the method 200 proceeds to operation 216, in which a dielectric fill layer 460 is deposited over the back side 404B of the substrate 404 to fill the pad openings 442 and trench 444 of each sensor chip 402. FIG. 10 is a cross-sectional view of the semiconductor structure of FIG. 9 after depositing the dielectric fill layer 460 over the back side 404B of the substrate 404 to fill the pad openings 442 and trench 444 of each sensor chip 402, in accordance with some embodiments.

The dielectric fill layer 460 is over the passivation layer 450 and the dielectric cap 454 to overfill the pad openings 442 and trench 444. That is, a top surface of the dielectric filling layer 460 is higher than the topmost surface of the passivation layer 450. The dielectric fill layer 460 includes a dielectric material such as, for example, silicon dioxide, silicon nitride, or silicon carbide. In some embodiments, the dielectric fill layer 460 is formed by, for example, CVD, PVD, or PECVD. In some embodiments, due to the high aspect ratio of the trench 444, the deposition of dielectric fill layer 460 generate voids or seams in the trench 444.

Figure 11:
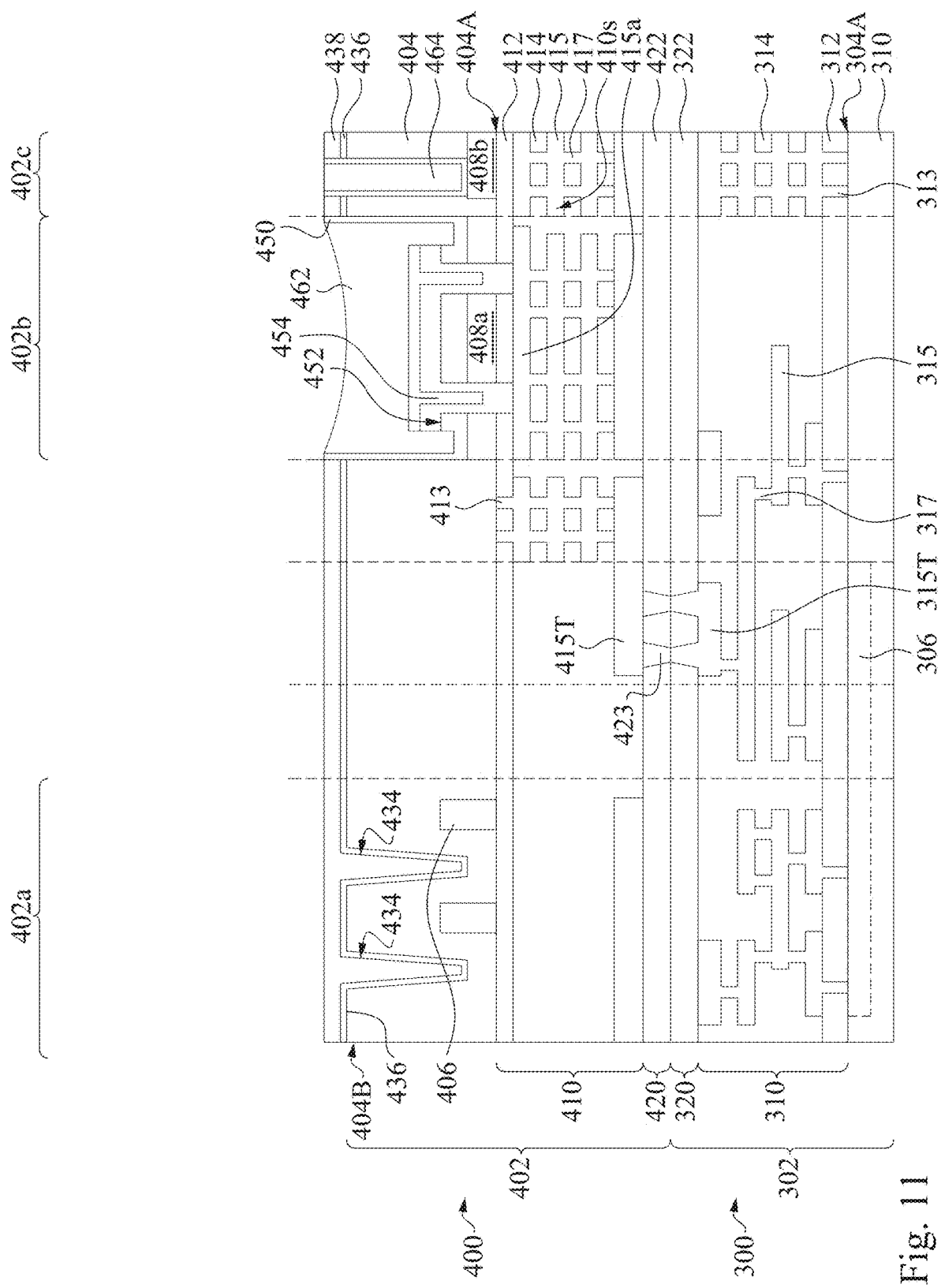

Referring to FIGS. 2 and 11, the method 200 proceeds to operation 218, in which first dielectric fill structures 462 are formed within the pad openings 442 and a second dielectric fill structure 464 is formed within the trench 444 of each sensor chip 402. FIG. 11 is a cross-sectional view of the semiconductor structure of FIG. 10 after forming the first dielectric fill structures 462 within the pad openings 442 and a second dielectric fill structure 464 within the trench 444 of each sensor chip, in accordance with some embodiments.

The dielectric fill structures 462 and 464 are formed by performing a planarization process that removes portions of the dielectric fill layer 460, the passivation layer 450, and the hard mask layer 440 overlying the dielectric fill layer 438 from the dielectric fill layer 438. In some embodiments, the planarization process is a CMP process. In other embodiments, the planarization process is an etching process and/or a grinding process, for example. After the planarization process, portions of the dielectric fill layer 460 remaining in the pad openings 442 constitutes the first dielectric fill structures 462, and a portion of the dielectric fill layer 460 remaining in the trench 444 constitutes the second dielectric fill structure 464. The top surfaces of the dielectric fill structures 462 and 464 are formed above, below, or coplanar with the top surface of the dielectric fill layer 438. In some embodiments, the top surface of at least one first dielectric fill structures 462 in the pad opening 442 is substantially dished due to the relatively large width of the pad opening 442. In some embodiments, the second dielectric fill structure 464 in trench 444 contains voids and seams. In some embodiments, the second dielectric fill structure 464 has a more planar surface than first dielectric fill structure 462 because the trench 444 is narrower than the pad openings 442. In some embodiments, the second dielectric fill structure 464 has a non-planar surface due to the presence of seams. In some embodiments, the second dielectric fill structure 464 has a concave surface.

The second dielectric fill structure 464 within the trench 444 in the periphery region 402c contains a dielectric material that is different from the semiconductor material of the substrate 404, the second dielectric fill structure 464 thus functions as a stress-releasing structure helping to release the stress in the wafer stack. The second dielectric fill structure 464 thus helps to reduce crack formation and to prevent cracks from propagating into the active circuit region (402a, 402b) of each sensor chip 402. As a result, the reliability of the sensor chip 402 is improved.

Figure 12:
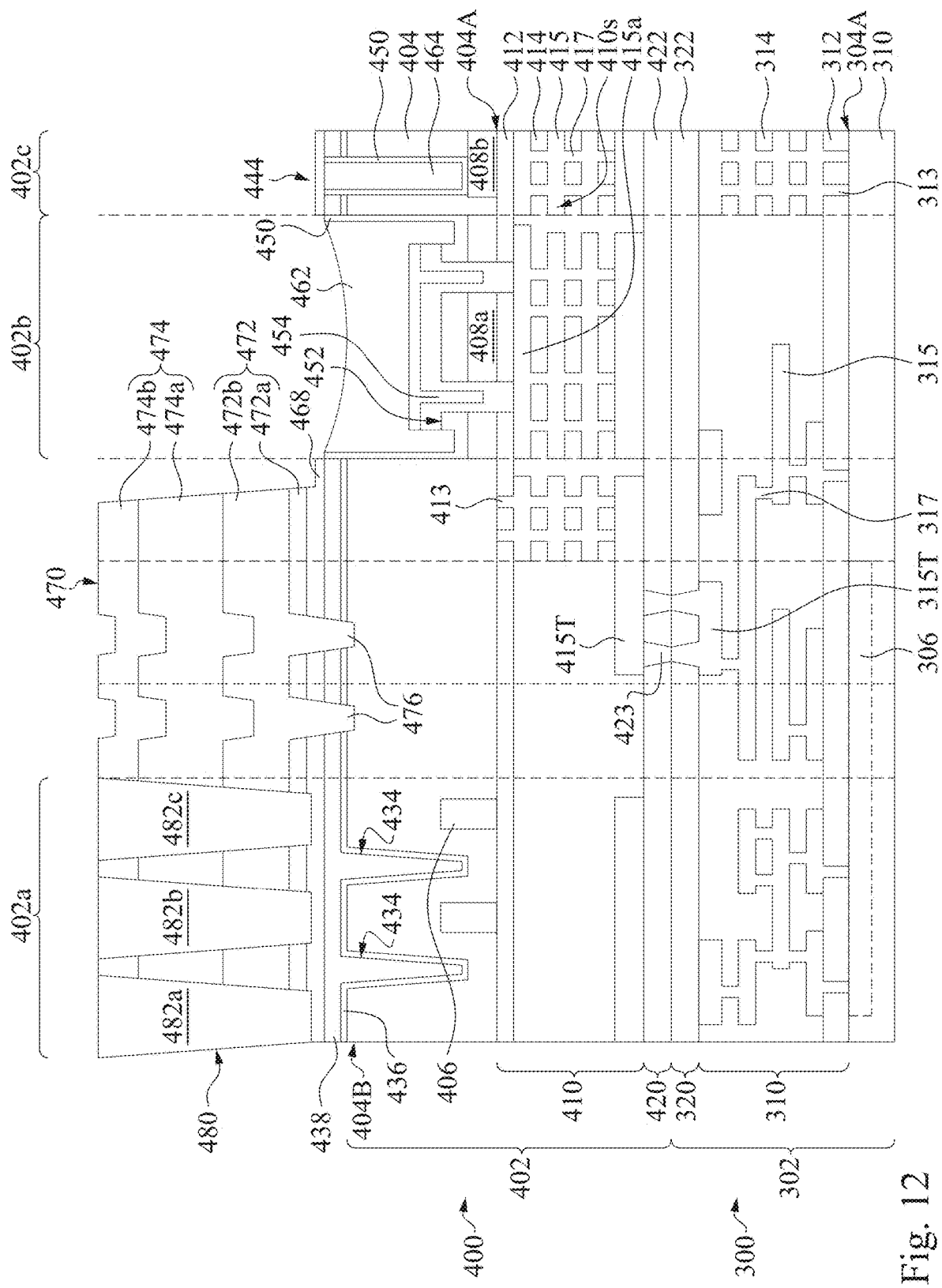

Referring to FIGS. 2 and 12, the method 200 proceeds to operation 220, in which a grid structure 470 is formed over the back side 404B of the substrate 404, and a plurality of color filters 482a-c is formed in cavities 480 of the grid structure 470. FIG. 12 is a cross-sectional view of the semiconductor structure of FIG. 11 after forming the grid structure 470 over the back side 404B of substrate 404 and forming the plurality of color filters 482a-c in cavities 480 of the grid structure 470, in accordance with some embodiments.

The grid structure 470 is formed over a buffer layer 468. The grid structure 470 is aligned with the DTI structures 434 that separate adjacent photosensitive elements 406. The grid structure 470 is configured to block light from reaching areas between the photosensitive elements 406, thereby helping to reduce crosstalk. In some embodiments, the grid structure 470 has a stacked structure including a metal grid layer 472, and a dielectric grid layer 474 over the metal grid layer 472. The metal grid layer 472 is coupled to the back surface of the substrate 404 through vias 476. The vias 476 help to eliminate the charges accumulated on the grid structure 470 to the substrate 404, thereby helping to reduce noise and the dark current of the sensor chip 402

The buffer layer 468 is over the dielectric fill layer 438. In some embodiments, the buffer layer 468 includes a dielectric material such as, for example, silicon dioxide, silicon nitride, or silicon oxynitride. In some embodiments, the buffer layer 468 is formed by a deposition process such as, for example, CVD, PVD, or PECVD.

The metal grid layer 472 is over the buffer layer 468. In some embodiments, the metal grid layer 472 includes a conductive metal such as, for example, copper, tungsten, aluminum, or an aluminum copper alloy. In some embodiments, the metal grid layer 472 has a bilayer structure including a first metal grid layer 472a and a second metal grid layer 472b overlying the first metal grid layer 472a. In some embodiments, the first metal grid layer 472a includes titanium nitride and the second metal grid layer 472b includes tungsten. In some embodiments, the metal grid layer 472 is formed by one or more deposition processes such as, for example, CVD, PVD, PECVD, or plating.

The dielectric grid layer 474 is over the metal grid layer 472. In some embodiments, the dielectric grid layer 474 includes a dielectric material such as silicon dioxide, silicon nitride, or silicon oxynitride. In some embodiments, the dielectric grid layer 474 has a bilayer structure including a first dielectric grid layer 474a and a second dielectric grid layer 474b overlying the first dielectric grid layer 474a. In some embodiments, the first dielectric grid layer 474a includes silicon dioxide, and the second cap grid layer 474b includes silicon oxynitride. In some embodiments, the dielectric grid layer 474 is formed by one or more deposition processes such as, for example, CVD, PVD, or PECVD.

The vias 476 extending through the buffer layer 468, the dielectric fill layer 438 and the dielectric liner layer 436 to electrically connect the metal grid layer 472 to the back surface of the substrate 404. In some embodiments, the vias 476 include a conductive material such as for example, copper, tungsten, aluminum, or an aluminum copper alloy.

In some embodiments, the grid structure 470 and the vias 476 are formed by first patterning the buffer layer 468, the dielectric fill layer 438 and the dielectric liner layer 436 to form via openings exposing portions of the back surface of substrate 404, and then depositing a meal layer over the buffer layer 468 to fill the via openings. Portions of the metal layer in the via openings constitute the vias 476. Subsequently, a dielectric layer a deposited over the metal layer. After depositing the dielectric layer, the dielectric layer and the metal layer are etched using one or more anisotropic etches to provide the grid structure 470. Each anisotropic etch includes a dry etch such as RIE or a wet etch. The grid structure 470 is formed to include a plurality of cavities 480 aligned with the underlying photosensitive elements 406 in substrate 404.

The color filters 482a-c are in the cavities 480, respectively. The color filters 482a-c are buried or embedded in the cavities 480 defined by the grid structure 470, thus are referred to as buried color filters (or a buried color filter array). The buried color filter configuration leads to shortened optical paths between the color filters 482a-c and the photosensitive elements 406, which helps to improve the reception of the light in the photosensitive elements 406.

The color filters 482a-c are associated with different colors. For example, color filter 482a is a red color filter configured to allow a red light to pass through but filter out all the other colors of light, color filter 482b is a green color filter configured to allow a green light to pass through but filter out all the other colors of light, and color filter 482c is a blue color filter configured to allow a blue light to pass through but filter out all the other colors of light. In some embodiments, the color filters 482a-482c include an organic material and are formed, for example, by spin coating.

Figure 13:
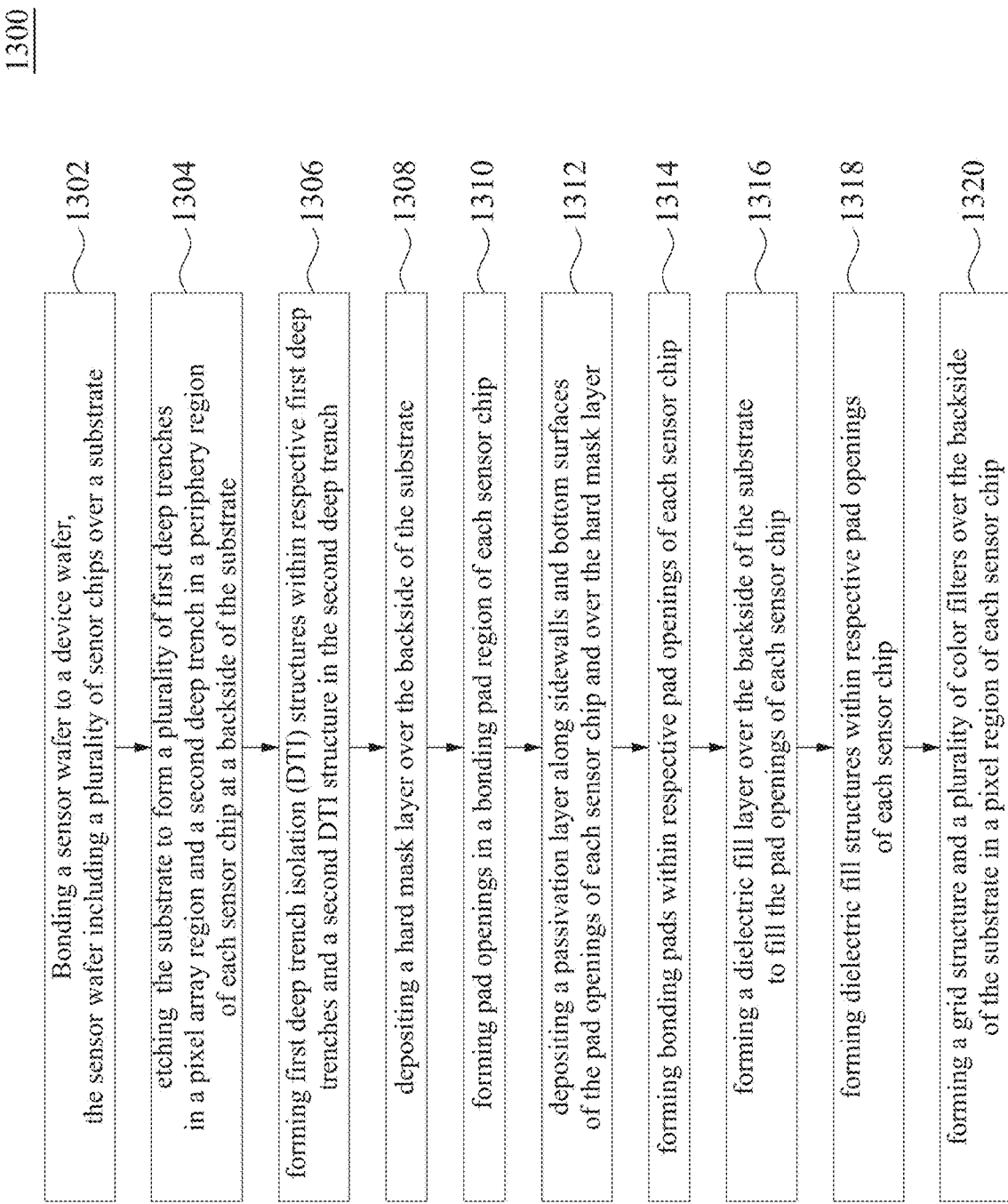
FIG. 13 is a flowchart of a method for fabricating a sensor chip having stress-releasing trench structures, in accordance with some embodiments.

FIG. 13 is a flow chart of a method 1300 for fabricating an image sensor wafer, e.g., image sensor device 100 having stress-releasing trench structures, e.g., stress-releasing trench structures 130, in accordance with some embodiments. In comparison with the method 200 in which the trenches for formation of stress-releasing trench structures are formed at the pad opening stage, in the method 1300, the trenches for formation of stress-releasing trench structures are formed at the deep trench etching stage.

FIGS. 14-22 are cross-section views of intermediate stages in the formation of the image sensor device 100, in accordance with some embodiments. Unless specified otherwise, the materials and the formation methods of the components in these embodiments are essentially the same as their like components, which are denoted by like reference numerals in the embodiments shown in FIGS. 2-12. The details regarding the formation processes and the materials of the components shown in FIGS. 14-22 are thus found in the discussion of the embodiments shown in FIGS. 2-12.

Referring to FIG. 13, the method 1300 includes operation 1302, in which a sensor wafer 400 is bonded to a device wafer 300 to provide a wafer stack. The sensor wafer 400 and the device wafer 300 in some embodiments have structures and compositions similar to those described in FIG. 3, and hence is not discussed in detail.

Figure 14:
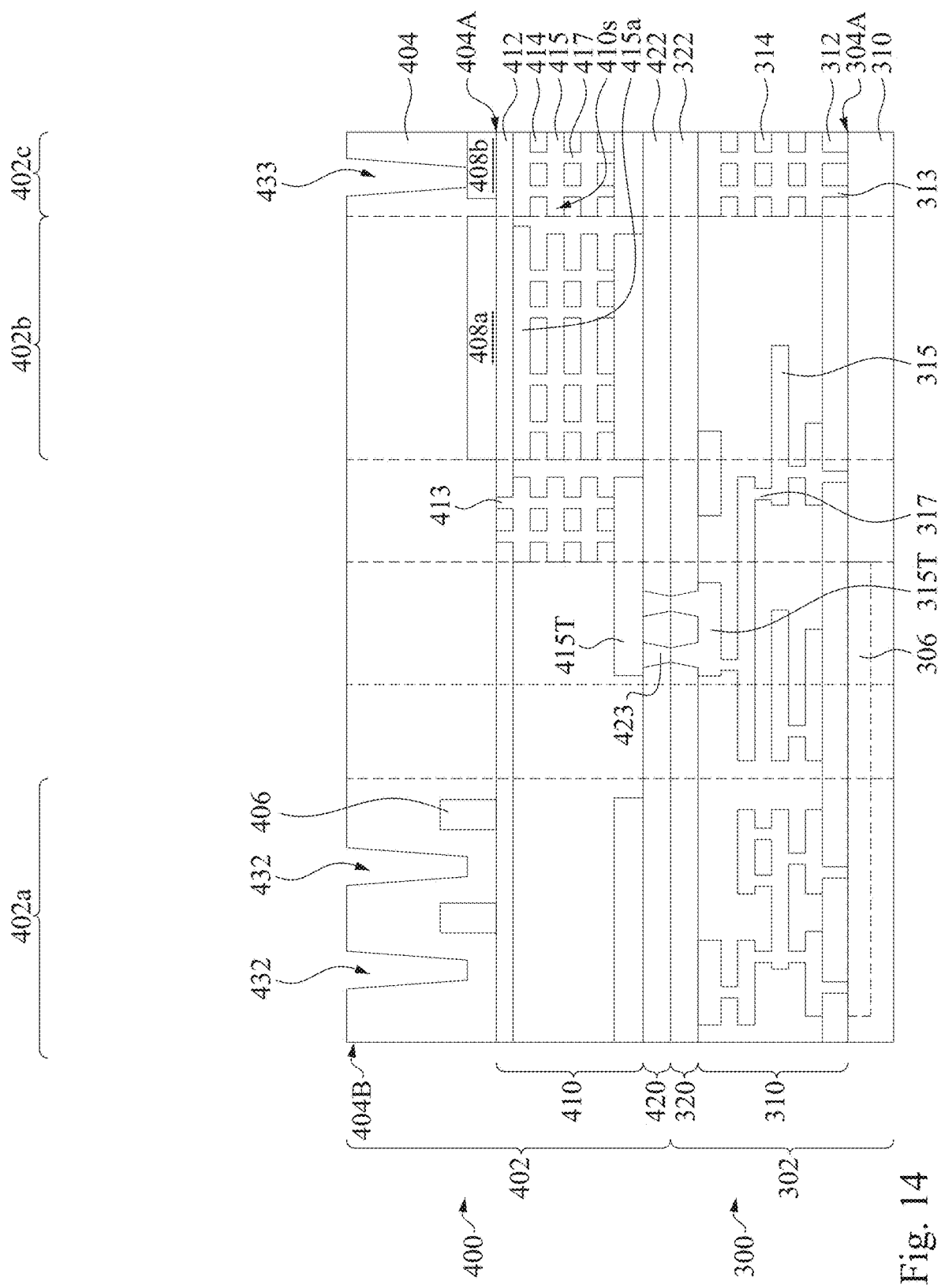
FIGS. 14-22 are cross-sectional views of a portion of a sensor chip having stress-releasing trench structures at various stages of fabrication, in accordance with some embodiments.

Referring to FIGS. 13 and 14, the method 1300 proceeds to operation 1304, in which a plurality of first deep trenches 432 is formed in the pixel array region 402*a* and a second deep trench 433 is formed in the periphery region 402*c* of each sensor chip 402. FIG. 14 is a cross-sectional view of the semiconductor structure of FIG. 3 after forming the plurality of first deep trenches 432 in the pixel array region 402*a* and the second deep trench 433 in the periphery region 402*c* of each sensor chip 402, in accordance with some embodiments. In FIG. 14, the first deep trenches 432 extend partially into the substrate 404 to separate the photosensitive elements 406 from one another. The second deep trench 433 extends through the substrate 404, exposing a portion of the second STI structure 408*b* in the periphery region 402*c* of each sensor chip 402. The second deep trench 433 is formed to extend around a perimeter of each sensor chip 402. In some embodiments, the second deep trench 433 has a continuous structure that completely surrounds the active circuit region (402*a*, 402*b*) of each sensor chip 402. In some embodiments, the second deep trench 433 includes multiple trench segments that are arranged along the perimeter of the active circuit region (402*a*, 402*b*) and together completely surround the active circuit region (402*a*, 402*b*) of each sensor chip 402. In some embodiments, a distance between opposite ends of adjacent trench segments is less than about 100 μm. The formation processes for deep trenches 432, 433 are similar to the processes described above with respect to formation of deep trenches 432 in FIG. 4, and hence are not described in detail. In some embodiments, the first deep trenches 432 are formed simultaneously with the second deep trench 433. In some embodiments, the first deep trenches are formed before or after the second deep trench 433.

Figure 15:
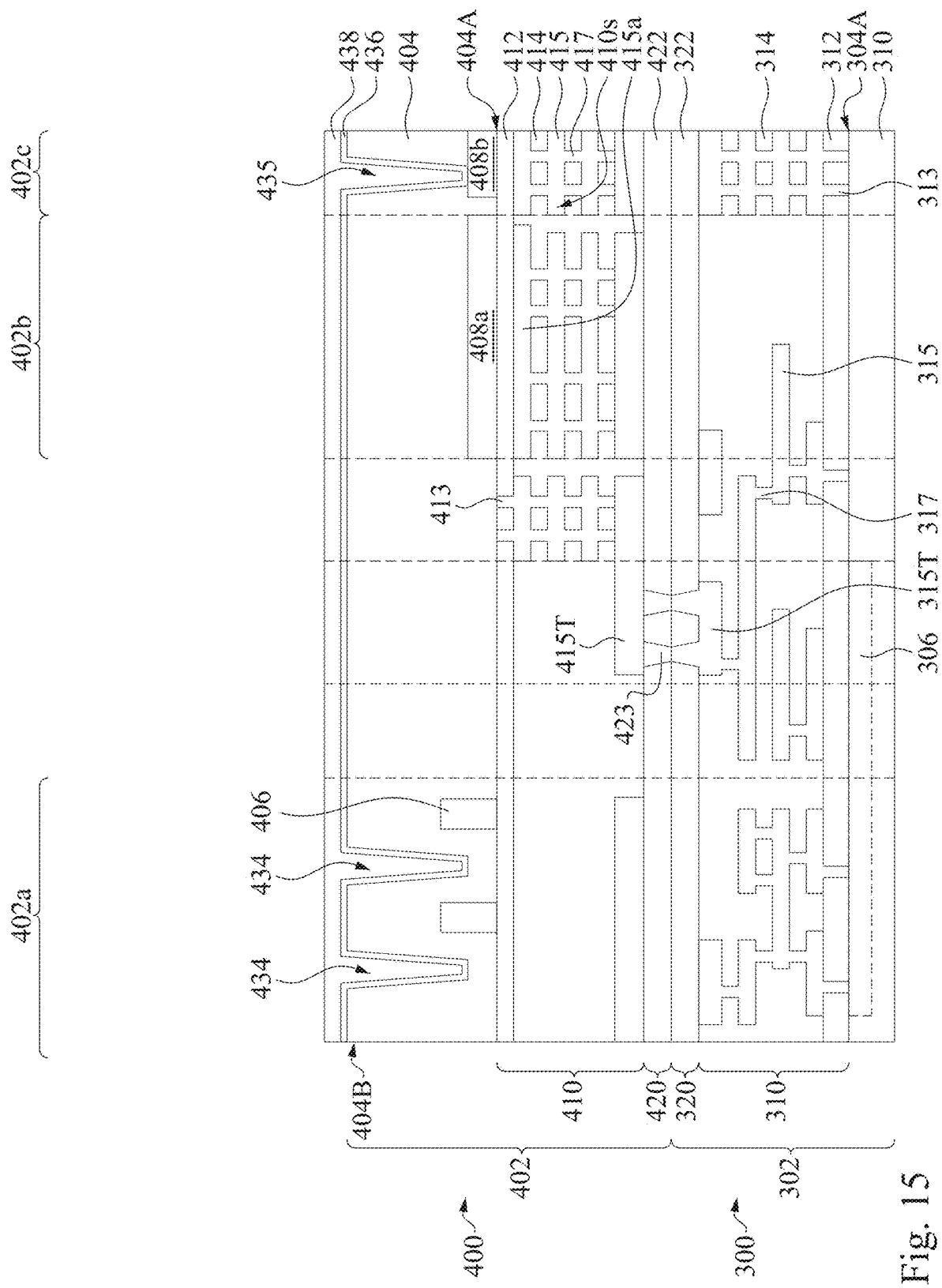

Referring to FIGS. 13 and 15, the method 1300 proceeds to operation 1306, in which a plurality of first DTI structures 434 is formed in respective first deep trenches 432 and a second DTI structure 435 is formed in the second deep trench 433 of each sensor chip 402. FIG. 15 is a cross-sectional view of the semiconductor structure of FIG. 14 after forming the plurality of first DTI structures 434 in respective first deep trenches 432 and the second DTI structure 435 is in the second deep trench 433 of each sensor chip 402, in accordance with some embodiments.

The first and second DTI structures 434 and 435 are formed by depositing a dielectric liner layer 436 along sidewalls and bottom surfaces of the first deep trenches 432 and the second deep trench 433 and over the back side surface of the substrate 404 followed by depositing a dielectric fill layer 438 over the dielectric liner layer 436 to fill the remaining volumes of the first and second deep trenches 432 and 433. A portion of the dielectric liner layer 436 and a portion of the dielectric fill layer 438 within each first deep trench 432 constitute a corresponding first DTI structure 434 in the pixel array region 402*a* of each sensor chip 402. The first DTI structures 434 separate adjacent photosensitive elements 406 from one another, thereby helping to reduce crosstalk between adjacent photosensitive elements 406. A portion of the dielectric liner layer 436 and a portion of the dielectric fill layer 438 within the second deep trench 433 constitute the second DTI structure 435 in the periphery region 402*c* of each sensor chip 402. In FIG. 15, the first DTI structures 434 extend partially into the substrate 404, while the second DTI structure 435 extend through the substrate 404 to contact the STI structure 408*b*. In some embodiments, the DTI structures 434 and 435 contain voids or seams therein due to the incomplete filling of the deep trenches 432 and 433. The composition of DTI structures 434 and 435 and formation processes for DTI structures 434 and 435 are similar to those described above with respect to DTI structures 434 in FIG. 5, and hence are not described in detail.

The second DTI structure 435 in the periphery region 402*c* of each sensor chip 402 contains dielectric materials different from the semiconductor material of the substrate 404, and is able to help to release stress generated during wafer dicing process. The DTI structure 435 thus functions as a stress-releasing structure, helping to release the stress in the wafer stack and to prevent the cracks produced during the die cut process from propagating into the active circuit region (402*a*, 402*b*) of each sensor chip 402. Introducing DTI structure 435 in the periphery region 402*c* of each sensor chip 402 thus helps to improve the reliability of the sensor chip 402.

Figure 16:
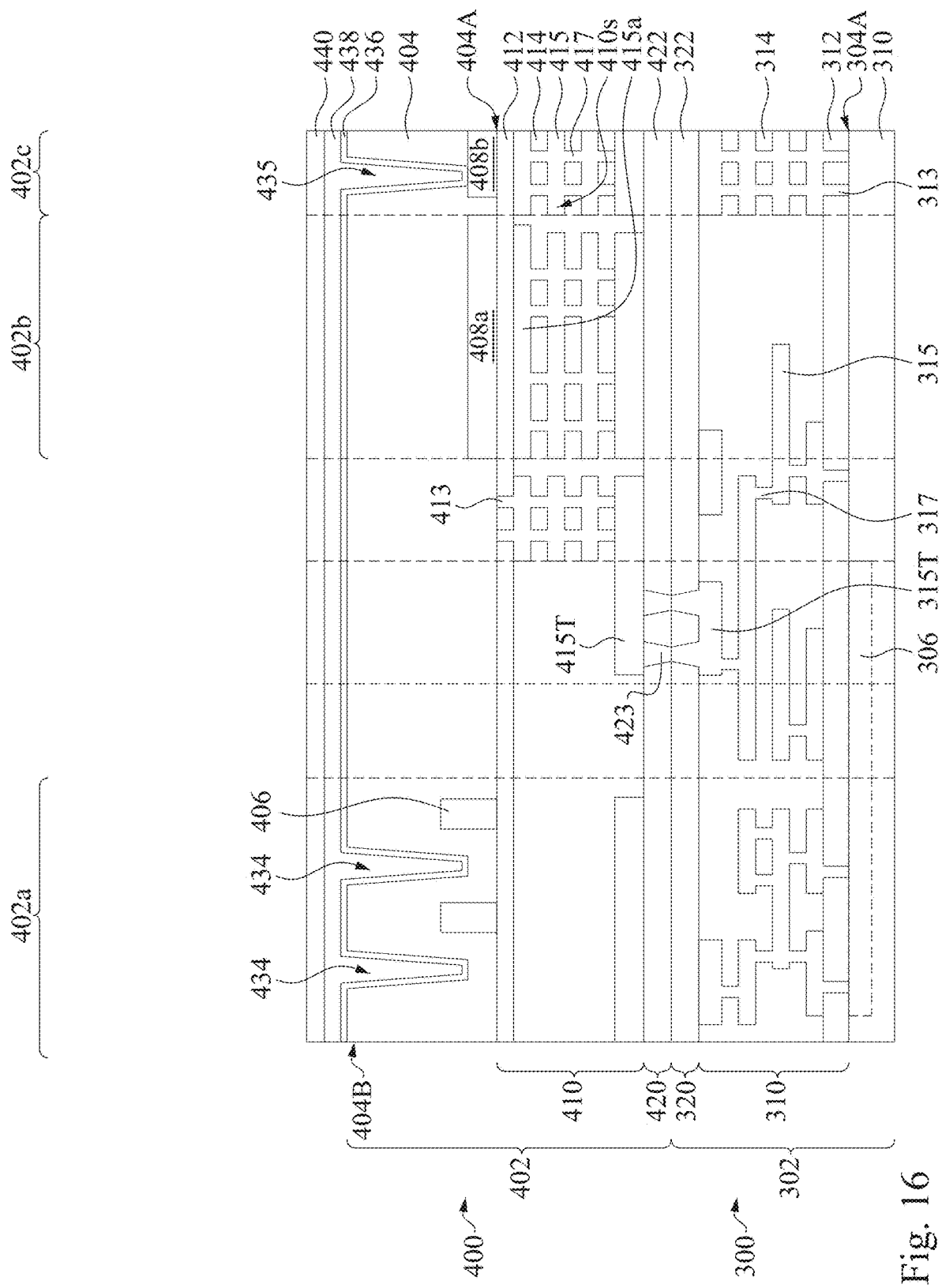

Referring to FIGS. 13 and 16, the method 1300 proceeds to operation 1308, in which a hard mask layer 440 is formed over the dielectric fill layer 438. FIG. 16 is a cross-sectional view of the semiconductor structure of FIG. 15 after forming the hard mask layer 440 over the dielectric fill layer 438, in accordance with some embodiments. The hard mask layer 440 cover the first and second DTI structures 434 and 435. The composition and formation process for hard mask layer 440 are similar to those described above with respect to hard mask layer 440 in FIG. 6, and hence are not described in detail.

Figure 17:
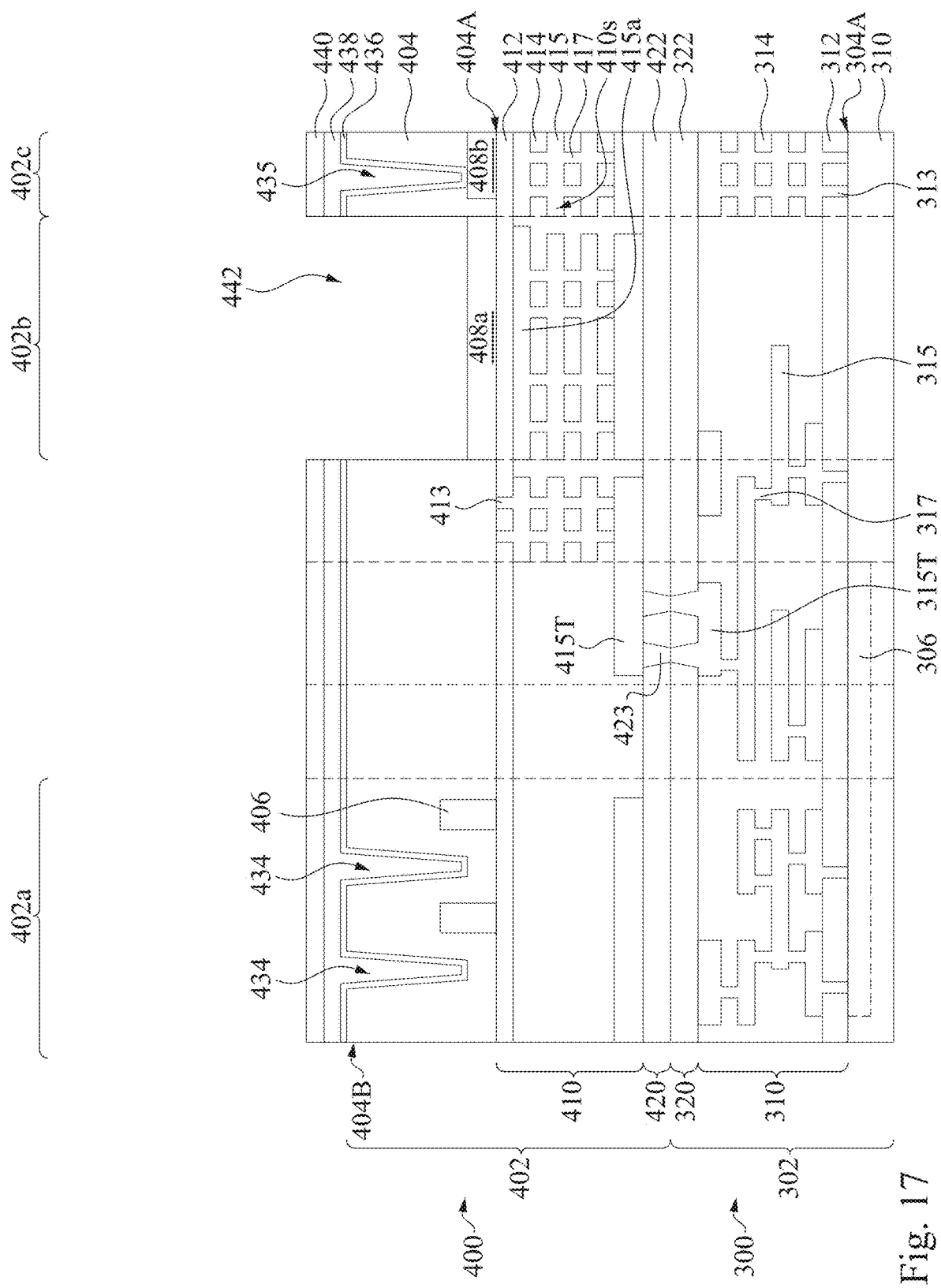

Referring to FIGS. 13 and 17, the method 1300 proceeds to operation 1310, in which the bonding pad region 402*b* of each sensor chip 402 is opened to form a plurality of pad openings 442. FIG. 17 is a cross-sectional view of the semiconductor structure of FIG. 16 after forming the plurality of pad openings 442 in each sensor chip 402, in accordance with some embodiments. The formation processes for pad openings 442 are similar to those described above with respect to formation of pad opening 442 in FIG. 7, and hence are not described in detail.

Figure 18:
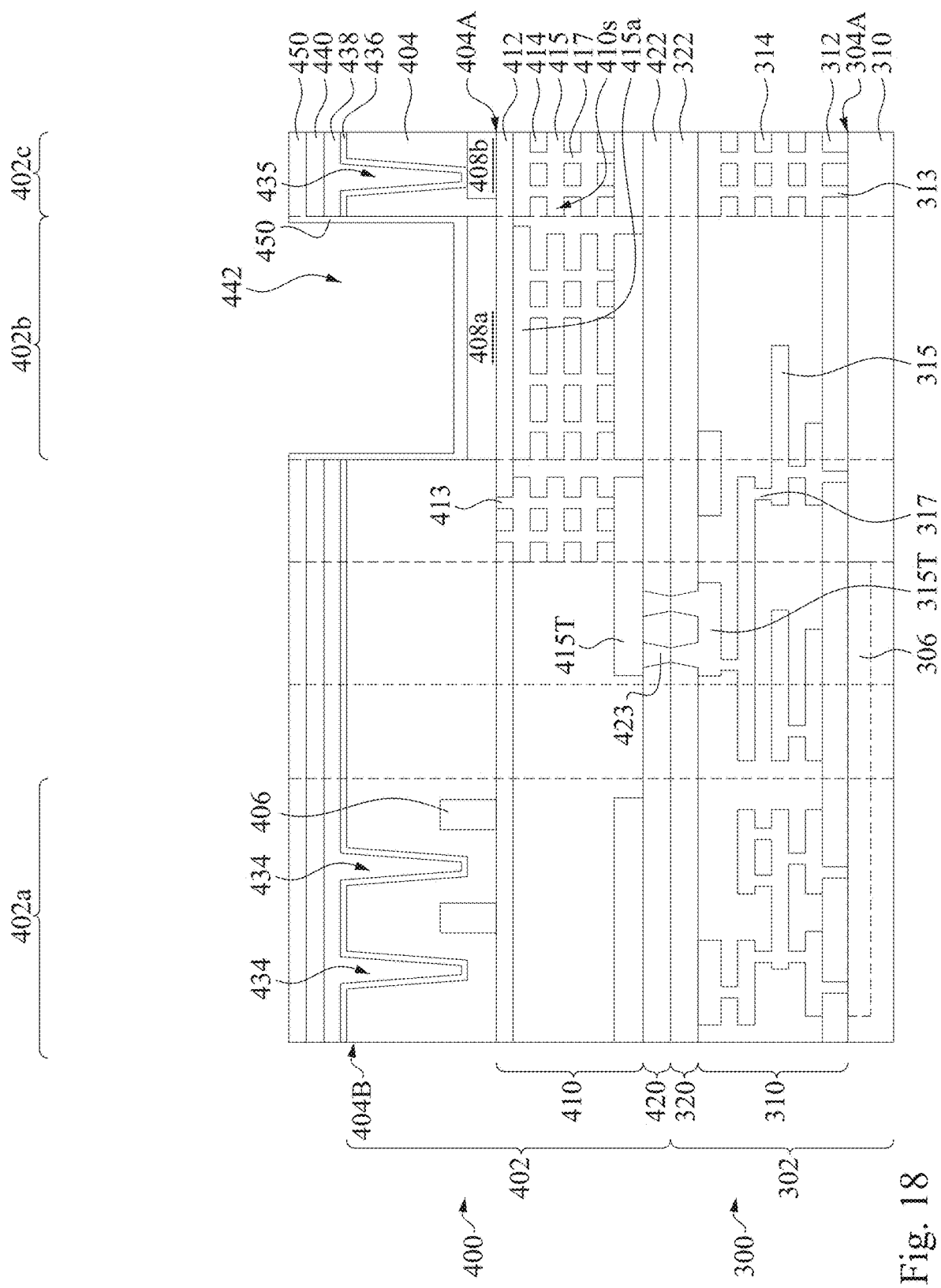

Referring to FIGS. 13 and 18, the method 1300 proceeds to operation 1312, in which a passivation layer 450 is formed over sidewalls and bottom surface of the pad openings 442 in each sensor chip 402 and over the hard mask layer 440. FIG. 18 is a cross-sectional view of the semiconductor structure of FIG. 17 after forming a passivation layer 450 over sidewalls and bottom surface of the pad openings 442 in each sensor chip 402 and over the hard mask layer 440, in accordance with some embodiments. The composition of passivation layer 450 and the formation process for passivation layer 450 are similar to those described above with respect to passivation layer 450 in FIG. 8, and hence are not described in detail.

Figure 19:
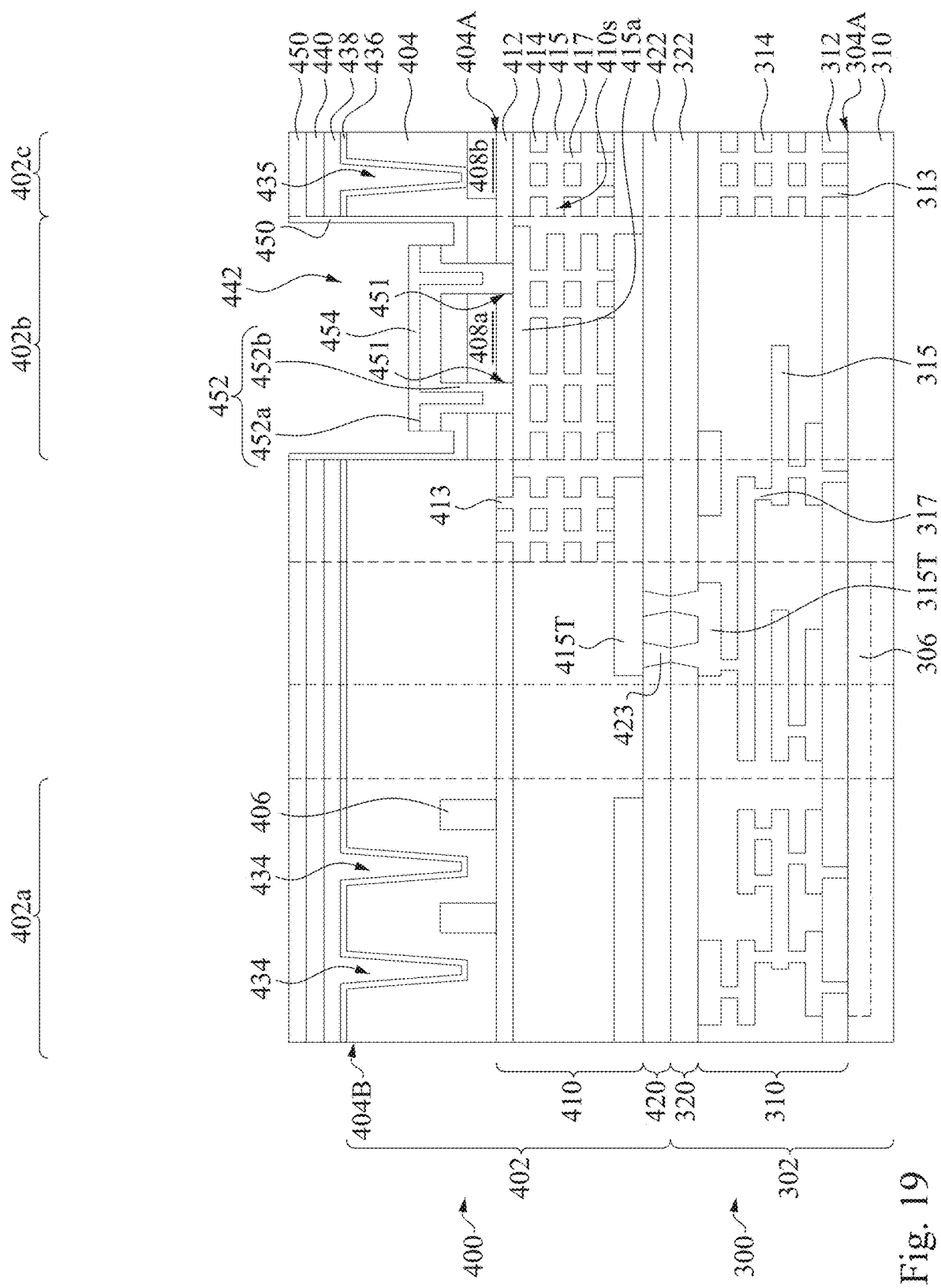

Referring to FIGS. 13 and 19, the method 1300 proceeds to operation 1314, in which bonding pads 452 and dielectric caps 454 are sequentially formed in respective pad openings 442 of each sensor chip 402. FIG. 19 is a cross-sectional view of the semiconductor structure of FIG. 18 after sequentially forming bonding pads 452 and dielectric caps 454 in respective pad openings 442 of each sensor chip 402, in accordance with some embodiments. The compositions formation processes for bonding pads 452 and dielectric caps 454 are similar to those described above with respect to bonding pads 452 and dielectric caps 454 in FIG. 9, and hence are not described in detail.

Figure 20:
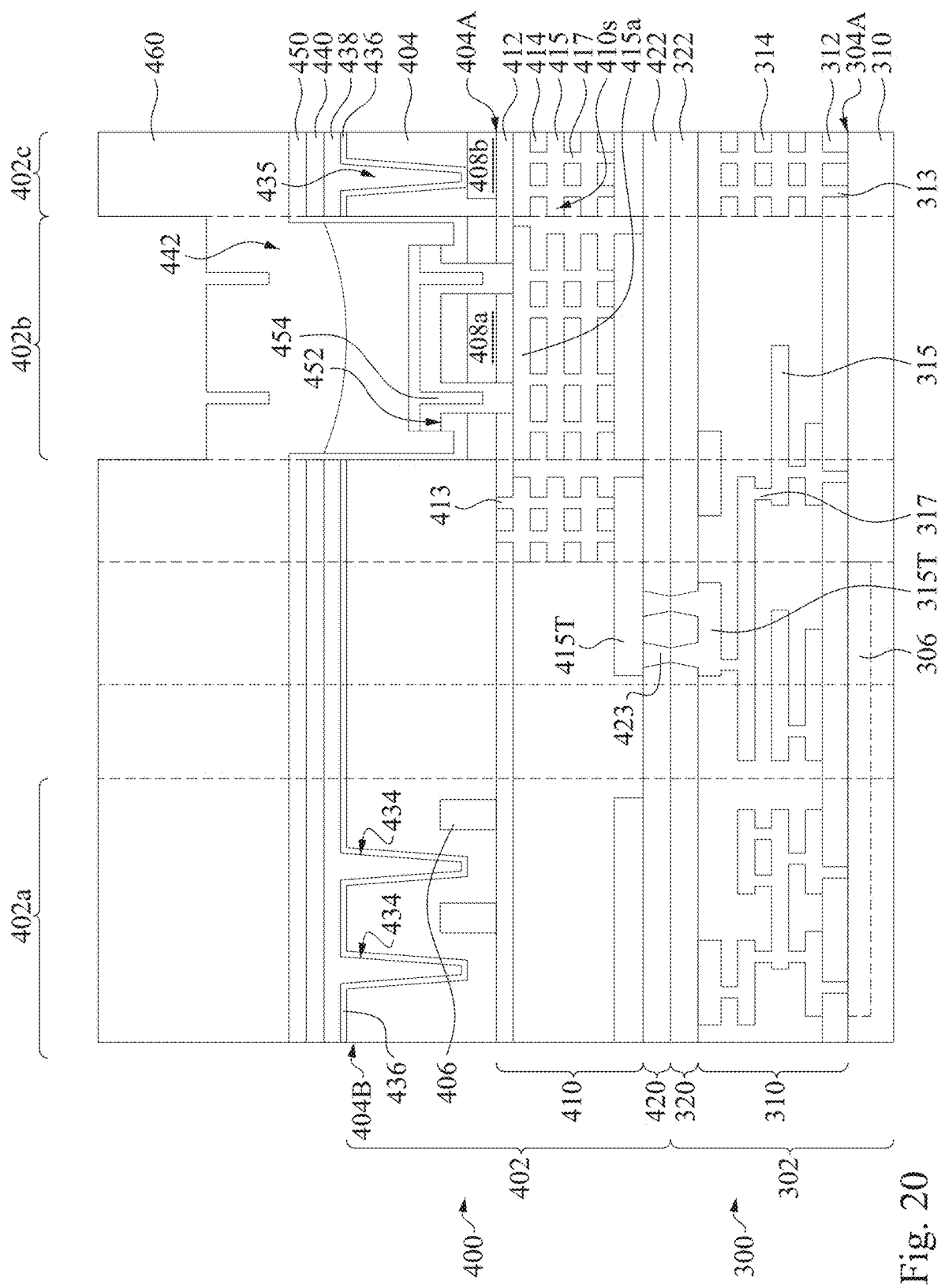

Referring to FIGS. 13 and 20, the method 1300 proceeds to operation 1316, in which a dielectric fill layer 460 is deposited to fill the pad openings 442 of each sensor chip 402. FIG. 20 is a cross-sectional view of the semiconductor structure of FIG. 19 after forming the dielectric fill layer 460 to fill the pad openings 442 of each sensor chip 402, in accordance with some embodiments. The composition of dielectric fill layer 460 and the formation processes for dielectric fill layer 460 are similar to those described above with respect to dielectric fill layer 460 in FIG. 10, and hence are not described in detail.

Figure 21:
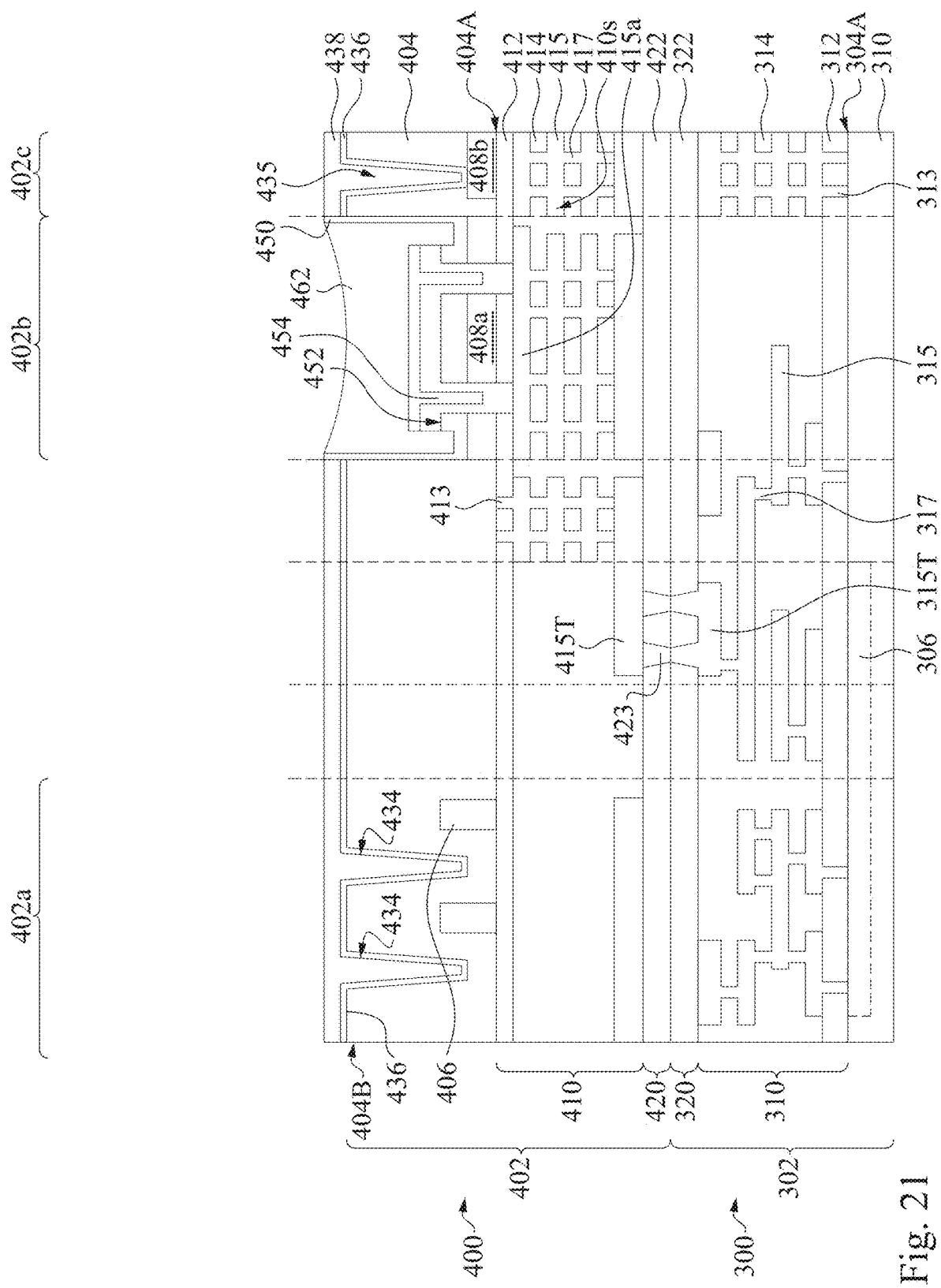

Referring to FIGS. 13 and 21, the method 1300 proceeds to operation 1318, in which a plurality of dielectric fill structures 462 are formed within respective pad openings 442 of each sensor chip 402. FIG. 21 is a cross-sectional view of the semiconductor structure of FIG. 20 after forming dielectric fill structures 462 in respective pad openings 442 of each sensor chip 402, in accordance with some embodiments. The dielectric fill structures 462 fill remaining volumes of respective pad openings 442. The composition of dielectric fill structures 462 and the formation process for dielectric fill structures 462 are similar to those described above with respect to dielectric fill structures 462 in FIG. 11, and hence are not described in detail.

Figure 22:
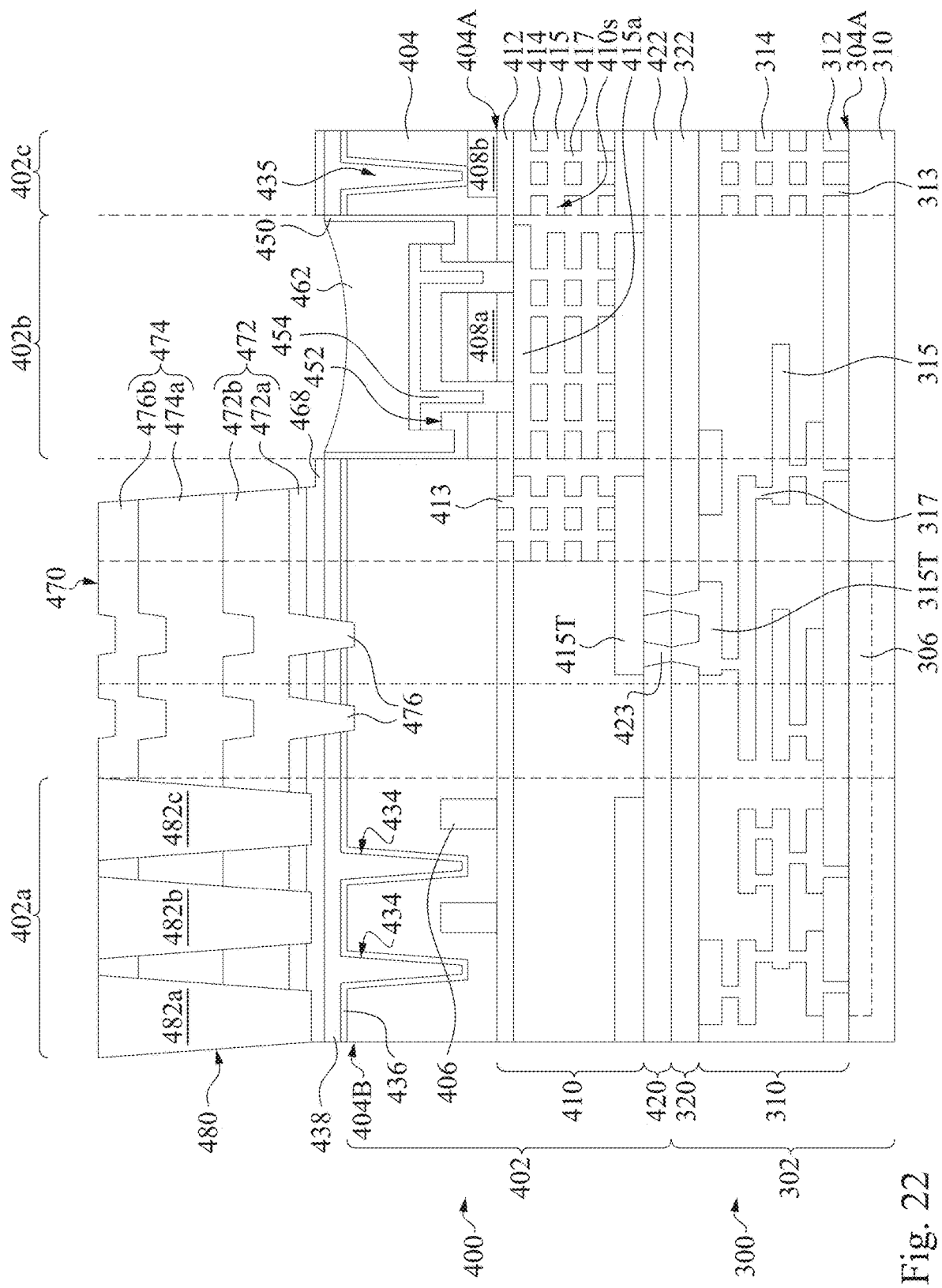

Referring to FIGS. 13 and 22, the method 1300 proceeds to operation 1320, in which a grid structure 470 and a plurality of color filters 482a-c are formed in each sensor chip 402. FIG. 21 is a cross-sectional view of the semiconductor structure of FIG. 21 after forming a grid structure 470 and a plurality of color filters 482a-c in each sensor chip 402, in accordance with some embodiments. The formation processes are similar to the process described above with respect to formation of grid structure 470 and color filters 482a-c in FIG. 12 and hence are not described in detail.

Figure 23:
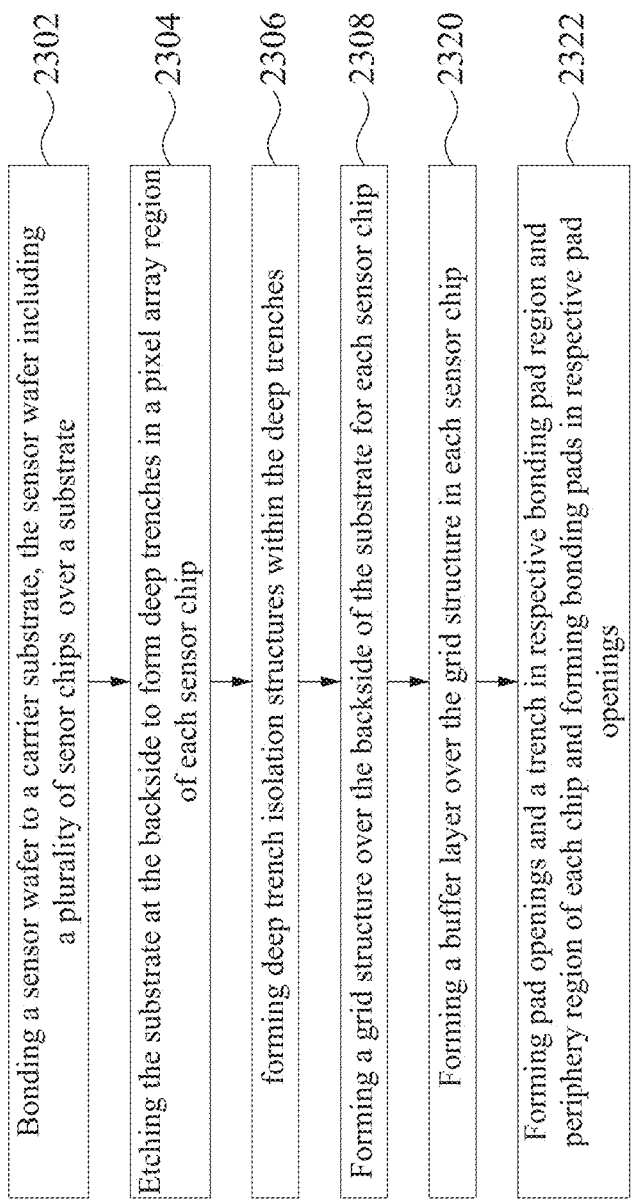
FIG. 23 is a flowchart of a method for fabricating a sensor chip having stress-releasing trench structures, in accordance with some embodiments.

FIG. 23 is a flow chart of a method 2300 for fabricating an image sensor wafer, e.g., image sensor device 100 having stress-releasing trench structures, e.g., stress-releasing trench structures 130, in accordance with some embodiments. FIGS. 24-29 illustrate cross-sectional views of the image sensor device 100 at various fabrication stages constructed according to the method 2300 of FIG. 23. The method 2300 is discussed in detail below, with reference to the image sensor device 100 in FIGS. 24-29. In some embodiments, additional operations are performed before, during, and/or after the method 2300, or some of the operations described are replaced and/or eliminated. In some embodiments, additional features are added to the image sensor device 100. In some embodiments, some of the features described below are replaced or eliminated. One of ordinary skill in the art would understand that although some embodiments are discussed with operations performed in a particular order, these operations may be performed in another logical order.

Figure 24:
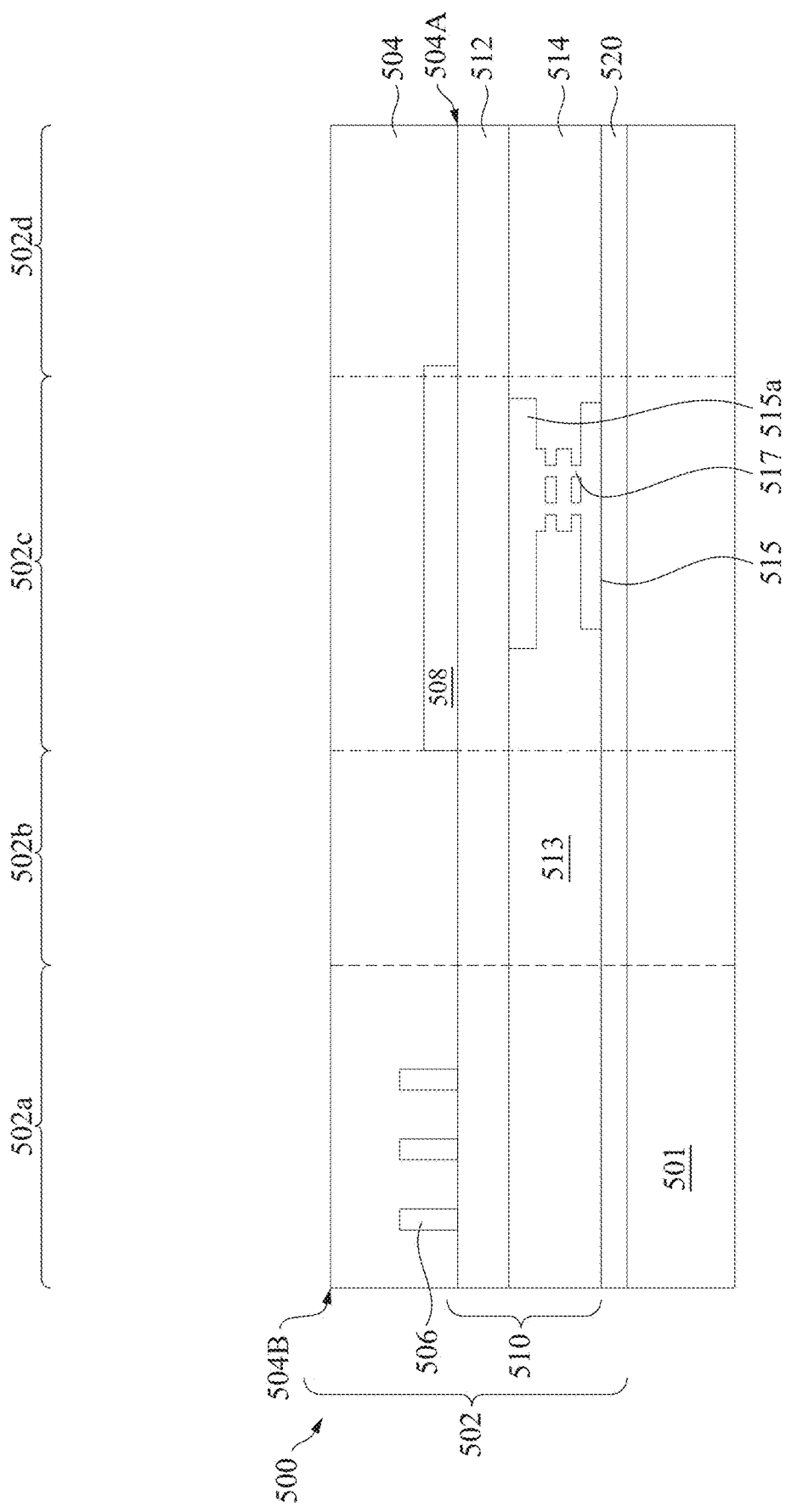
FIGS. 24-29 are cross-sectional views of a portion of a sensor chip having stress-releasing trench structures at various stages of fabrication, in accordance with some embodiments.

Referring to FIGS. 23 and 24, the method 2300 includes operation 2302, in which a sensor wafer 500 is bonded to a carrier substrate 501 (also referred to as a carrier wafer) to provide a wafer stack. FIG. 24 is a cross-sectional view of a semiconductor structure after bonding a sensor wafer 500 to a carrier substrate 501 to provide a wafer stack, in accordance with some embodiments.

Referring to FIG. 24, the sensor wafer 500 includes a plurality of sensor chips 502 arranged in rows and columns. Each sensor chip 502 includes a pixel array region 502a, a logic region 502b, a bonding pad region 502c, and a periphery region 502d. The pixel array region 502a includes an array of photosensitive elements 406 arranged in rows and columns. The logic region 502b includes logic devices for supporting operation of the pixel array, such as logic devices for supporting readout of pixel array. In some embodiments, the logic region 502b includes transistors, capacitors, inductors, or resistors. The bonding pad region 502c includes a plurality of bonding pads for connecting the pixel array to external devices. The pixel array region 502a, the logic region 502b, and the bonding pad region 502c constitute an active circuit region of each sensor chip 502. The periphery region 502d is adjacent to the scribe lines between the sensor chips 502 and laterally surrounds the pixel array region 502a, the logic region 503b, and the bonding pad region 502c.

The sensor chips 502 are on/within a substrate 504. In some embodiments, the substrate 504 is a crystalline silicon substrate or a semiconductor substrate formed of other semiconductor materials such as germanium silicon germanium, III-V compound semiconductors, or the like. The substrate 504 has a front side (also referred to as a front surface) 504A and a back side (also referred to as a back surface) 504B.

Each sensor chip 502 includes a plurality of photosensitive elements 506 in the front side 504A of the substrate 504. The photosensitive elements 506 correspond to pixels and are operable to sense radiation, such as an incident light that is projected toward the back side 504B of the substrate 504 and convert light signals (photons) to electrical signals. In some embodiments, the photosensitive elements 506 are photodiodes. In such embodiments, each of the photosensitive elements 506 includes a first region within the substrate 504 having a first doping type (e.g., n-type) and an adjoining second region within the substrate 504 having a second doping type (e.g., p-type) that is different from the first doping type. The photosensitive elements 506 are varied from one another to have different junction depths, thicknesses, and widths. For reasons of simplicity, only two photosensitive elements 506 are shown in FIG. 24, but it is understood that any number of photosensitive elements 506 are implemented in the substrate 504. The photosensitive elements 506 are in the pixel array region 502a and are arranged in an array comprising rows and/or columns Each sensor chip 502 further includes a plurality of shallow trench isolation (STI) structures 508 at the front side 504A of the substrate 504. A STI structure 508 is shown in the bonding pad region 502c. The STI structures 508 extend from the front side 504A of the substrate 504 into the substrate 504. In some embodiments, the STI structures 508 include one or more dielectric materials. In some embodiments, the STI structures 508 include a dielectric oxide such as, for example, silicon dioxide. The STI structures 508 are formed by etching openings into the substrate 504 from the front side 504A and thereafter filling the openings with the dielectric material(s).

Each sensor chip 502 further includes an interconnect structure 510 over the front side 504A of the substrate 504. The interconnect structure 510 includes an ILD layer 512 and metal contacts 513 in the ILD layer 512. The interconnect structure 510 further includes an IMD layer 514 and one or more metal interconnect layers having alternating metal lines 515 and vias 517 in the IMD layer 514. In some embodiments, the ILD layer 512 includes a dielectric material such as, for example silicon dioxide, silicon carbide, silicon nitride, or silicon oxynitride. The IMD layer 514 includes a low-k dielectric materials having a dielectric constant less than 3.9. In some embodiments, the IMD layer 514 includes TEOS oxide, undoped silicate glass, or doped silicate glass such as BPSG, FSG, PSG, or BSG. The IMD layer 514 is a single layer or a composite layer comprising a plurality of layers of a same material or different materials. The metal contacts 513, metal lines 515 and vias 517 independently include a conductive material, such as copper, aluminum, tungsten, titanium, alloys thereof, or combinations thereof.

A passivation layer 520 is deposited over the interconnect structure 510. The passivation layer 520 helps to protect the underlying layers from physical and chemical damages. The passivation layer 520 includes one or more dielectric material such as silicon dioxide or silicon nitride. In some embodiments, the passivation layer 520 is formed using a deposition process such as CVD, PVD, or PECVD. After deposition, the passivation layer 520 is planarized, for example, by CMP, to form a planar surface.

Thereafter, the carrier substrate 501 is bonded to the sensor wafer 500 through the passivation layer 520. The carrier substrate 501 provides mechanical support so that the sensor wafer 500 does not break in the formation of structures on the back side 504B of the substrate 504. In some embodiments, the carrier substrate 501 is a silicon substrate. Alternatively, the carrier substrate 501 is a glass substrate or a quartz substrate. In some embodiments, the carrier substrate 501 is bonded to the passivation layer 520 using an adhesive layer. In some embodiments, the carrier substrate 501 is bonded to passivation layer 520 using oxide-to-oxide bonding.

After the sensor wafer 500 is bonded to the carrier substrate 501, a thinning process is performed to thin the substrate 504 from the back side 504B, such that light is able to strike the photosensitive elements 506 through the substrate 504 without being absorbed by the substrate 504. The thinning process includes mechanical grinding, CMP, etching, or combinations thereof. In some embodiments, a substantial amount of substrate material is first removed from the substrate 504 by mechanical grinding. Afterwards, a wet etching is performed to further thin the substrate 504 to a thickness that is transparent to the incident light. After the thinning process, the substrate 504 has a thickness from about 1 µm to about 5 µm. If the substrate 504 following the thinning process is too thick, too much incident light will be absorbed. If the substrate 504 following the thinning process is too thin, a risk of damage to underlying elements increases during subsequent processing.

Figure 25:
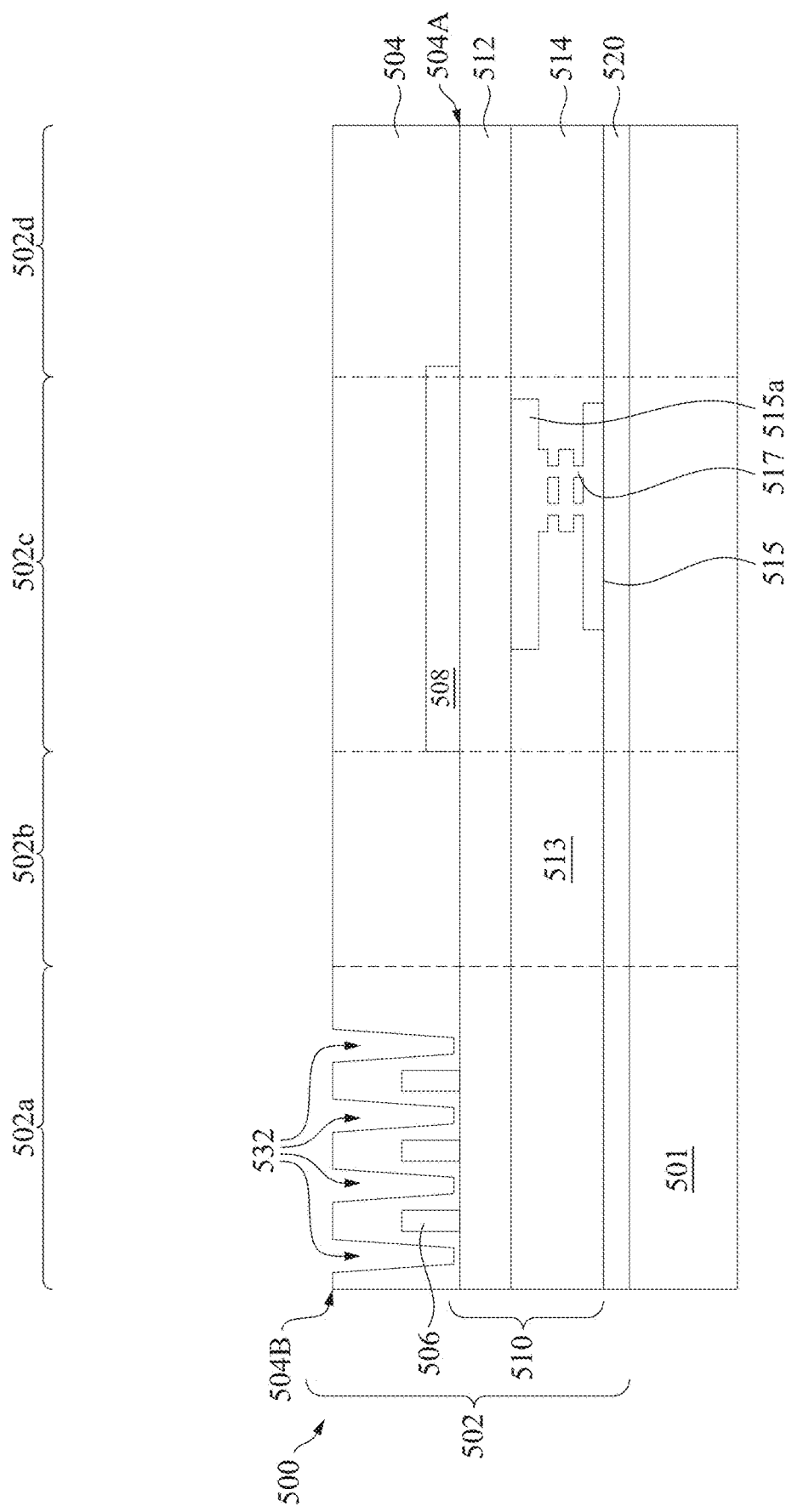

Referring to FIGS. 23 and 25, the method 2300 proceeds to operation 2304, in which the substrate 504 is etched from the back side 504B to form deep trenches 532 within the substrate 504 in the pixel array region 502a of each sensor chip 502. FIG. 25 is a cross-sectional view of the semiconductor structure of FIG. 24 after etching the deep trenches 532 within the back side 504B of the substrate 504 in the pixel array region 502a of each sensor chip 502.

Referring to FIG. 25, the deep trenches 532 extend from the back side surface of the substrate 504 into the substrate 504. The deep trenches 532 separate the photosensitive elements 506 from one another such that deep trench isolation (DTI) structures 534 (FIG. 26) subsequently formed therein are capable of reducing crosstalk and interference between adjacent photosensitive elements 506. In some embodiments, the deep trenches 532 have a depth from about 0.5 µm to about 2 µm and a width equal to or less than about 0.25 µm. Dimensions of deep trenches 532 are selected to avoid cross-talk between pixels and maximize incident light reaching the photosensitive elements 506. In some embodiments, a cross-section of at least one deep trench 532 has a trapezoidal shape with inclined sidewalls. In such configuration, a width of at least one the deep trench 532 decreases as a distance from the back side 504B of the substrate 504 increases. In some embodiments, a cross-section of at least one deep trench 532 has a rectangular shape with substantially vertical sidewalls.

The deep trenches 532 are formed by lithography and etching processes. In some embodiments, a photoresist layer (not shown) is first applied over the back side 504B of the substrate 504 by spin coating. The photoresist layer is then patterned using a photolithography process that involves exposure, baking, and developing of the photoresist to form a patterned photoresist layer having openings therein. The openings expose portions of the substrate 504 where the deep trenches 532 are subsequently formed. The openings in the patterned photoresist layer are transferred into the substrate 504 to form the deep trenches 532, for example by using an anisotropic etch. In some embodiments, the anisotropic etch includes a dry etch such as, for example, reactive ion etch (RIE) or a plasma etch, a wet chemical etch, or combinations thereof. After formation of deep trenches 532, the patterned photoresist layer is removed, for example, by wet stripping or plasma ashing. Alternatively, in some embodiments, a hard mask layer comprising a nitride (e.g., silicon nitride) is used such that the trench pattern is transferred from the pattered photoresist layer to the hard mask layer by a first anisotropic etch and then transferred to the substrate 504 by a second anisotropic etch.

Figure 26:
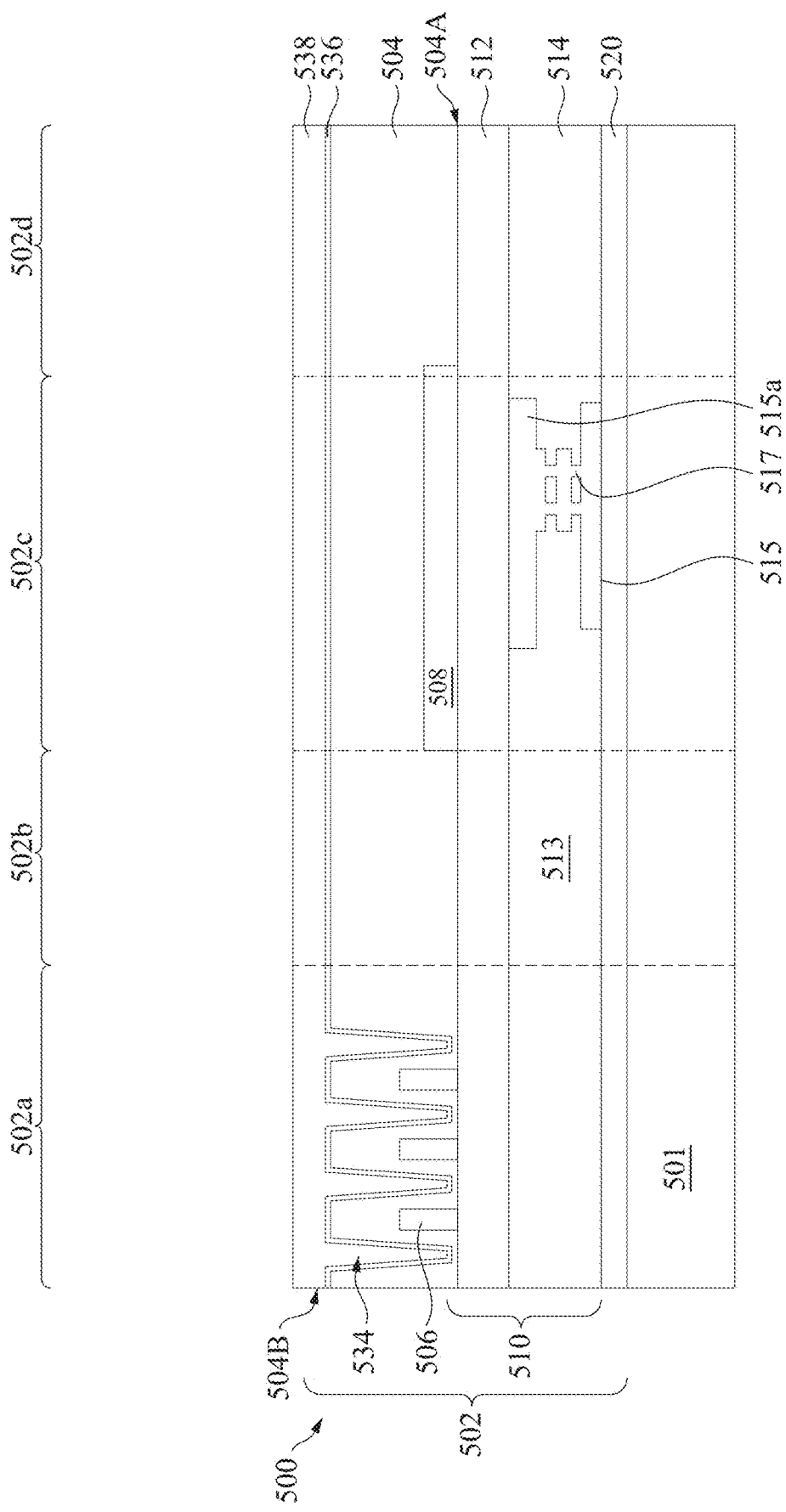

Referring to FIGS. 23 and 26, the method 2300 proceeds to operation 2306, in which DTI structures 534 are formed within the deep trenches 532 by depositing a dielectric liner layer 536 along sidewalls and bottom surfaces of the deep trenches 532 followed by depositing a dielectric fill layer 538 over the dielectric liner layer 536 to fill the deep trenches 532. FIG. 26 is a cross-sectional view of the semiconductor structure of FIG. 25 after forming the DTI structures 434 within the deep trenches 532, in accordance with some embodiments.

Referring to FIG. 26, the dielectric liner layer 536 is first deposited along sidewalls and bottom surfaces of the deep trenches 532 and over back side surface of the substrate 504. The dielectric liner layer 536 has a single layer or a multi-layer structure. In some embodiments, the dielectric liner layer 536 includes one or more high-k dielectric material having a dielectric constant greater than 3.9. Example high-k dielectric materials include, but are not limited to, $HfO_2$, $ZrO_2$, $La_2O_3$, $Al_2O_3$, $TiO_2$, $SrTiO_3$, $LaAlO_3$, and $Y_2O_3$. In some embodiments, the dielectric liner layer 536 includes a bilayer of $Al_2O_3$ and $Ta_2O_5$. In some embodiments, the dielectric liner layer 536 is deposited utilizing a conformal deposition process such as, for example, CVD, PECVD, or ALD.

The dielectric fill layer 538 is then deposited over the dielectric liner layer 536 to fill the deep trenches 532. In some embodiments, the dielectric fill layer 538 includes a dielectric material having a good gap filling characteristics. In some embodiments, the dielectric fill layer 538 includes a dielectric oxide such as silicon dioxide, a dielectric nitride such as silicon nitride, or a dielectric carbide such as silicon carbide. In some embodiments, the dielectric fill layer 538 is deposited by a deposition process such as CVD, PECVD, or PVD. In some embodiments, a planarization process such as, for example, CMP is performed after the forming the dielectric fill layer 538 to provide a planar surface. After the planarization, the planar surface of the dielectric fill layer 538 is above the back side surface of the substrate 504.

Portions of the dielectric liner layer 536 on sidewalls and bottom surfaces of the deep trenches 532 and portions of a dielectric fill layer 538 within the deep trenches 532 constitute the DTI structures 534. The DTI structures 534 separate adjacent photosensitive elements 506 from one another, thereby helping to reduce crosstalk and interference between adjacent photosensitive elements 506.

Figure 27:
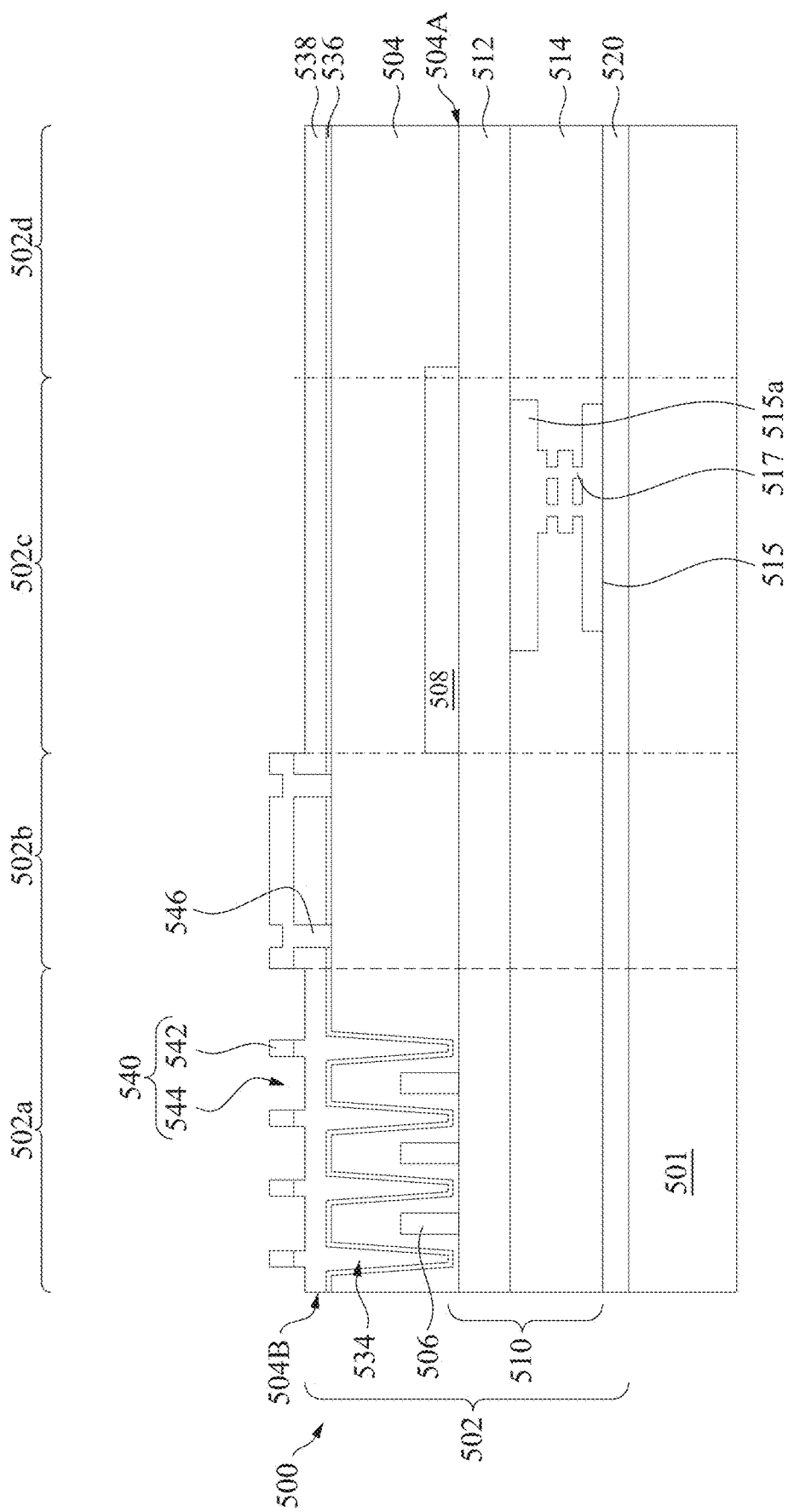

Referring to FIGS. 23 and 27, the method 2300 proceeds to operation 2308, in which a grid structure 540 is formed over the back side 504B of the substrate 504 for each sensor chip 502. FIG. 27 is a cross-sectional view of the semiconductor structure of FIG. 26 after forming the grid structure 540 over the back side 504B of the substrate 504 for each sensor chip 502, in accordance with some embodiments.

Referring to FIG. 27, the grid structure 540 is over the dielectric fill layer 538 and includes a plurality of metal grids 542 and a plurality of cavities 544 separating the metal grids 542 from one another. The metal grids 542 in the pixel array region 502a are aligned with DTI structures 534 and are configured to block light from reaching areas between the photosensitive elements 506, thereby heling to reduce crosstalk of the photosensitive elements 506. A metal grid 542 in the logic region 502b is electrically coupled to the back side surface of the substrate 504 through vias 546 so as to help to eliminate the charges accumulated in the grid structure 540 to the substrate 504. As a result, the noise and dark current effect of each sensor chip 502 are reduced. The metal grids 542 include a conductive metal such as, for example, copper, tungsten, aluminum, or an aluminum copper alloy The grid structure 540 and vias 546 are formed by first etching the dielectric fill layer 538 to form via openings within which the vias 546 are subsequently formed. In some embodiments, an anisotropic etch is performed to etch the dielectric fill layer 538. The anisotropic etch is a dry etch such as RIE or a wet etch. A metal layer is then deposited over the dielectric fill layer 538 by for example, CVD, PVD, PECVD, or plating. The metal layer fills the via openings to provide the vias 546. A portion of the metal layer located above the dielectric fill layer 538 is then etched to provide the metal grids 542 using an anisotropic etch including a dry etch or a wet etch. In some embodiments, the anisotropic etch employed to etch the metal layer also etches the dielectric fill layer 538, forming dielectric pillars underneath the metal grids 542 in the pixel array region 502a.

Figure 28:
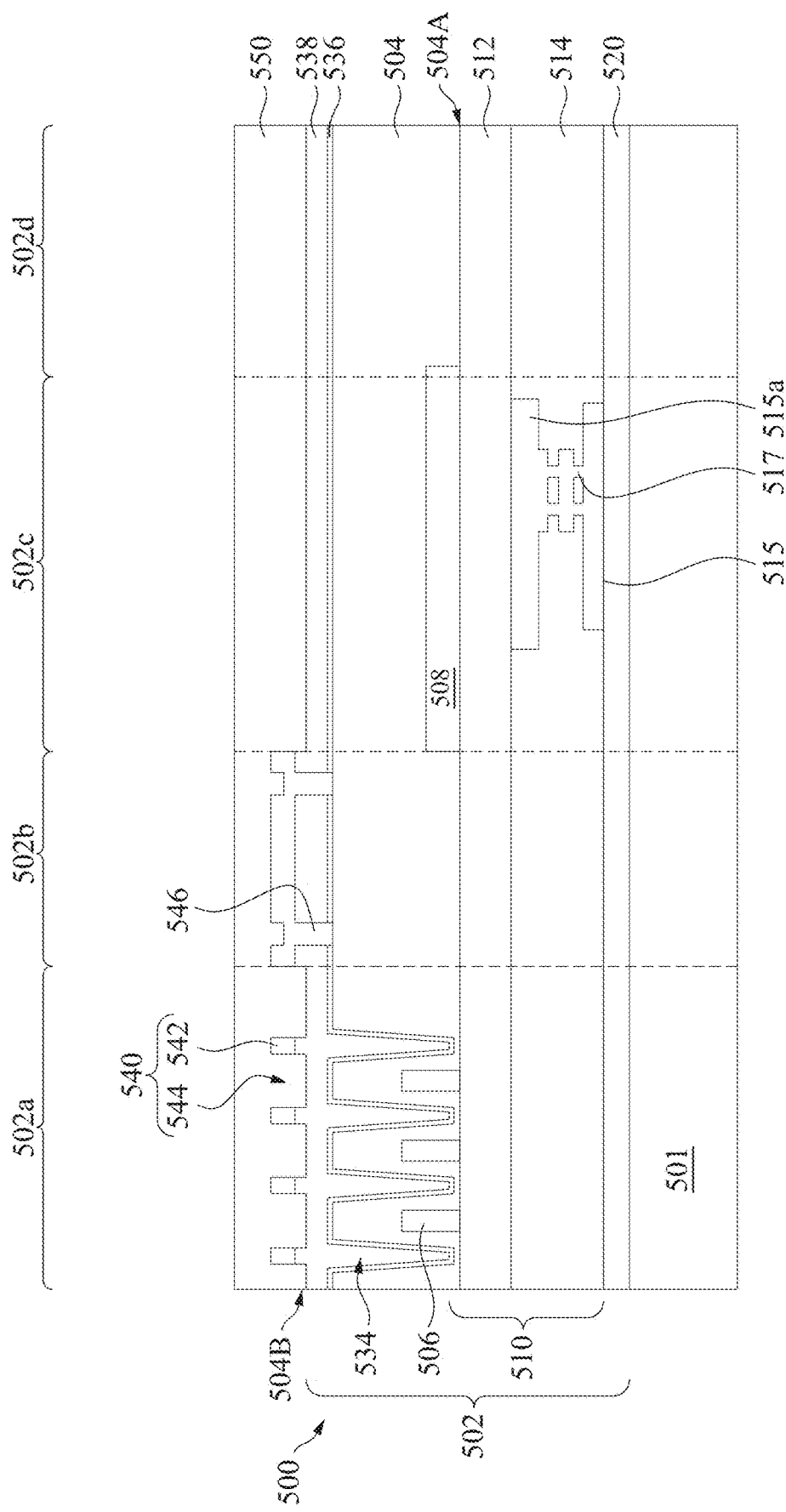

Referring to FIGS. 23 and 28, the method 2300 proceeds to operation 2310, in which a buffer layer 550 is formed over the grid structure 540 and the dielectric fill layer 538 in each sensor chip 502. FIG. 28 is a cross-sectional view of the semiconductor structure of FIG. 27 after forming the buffer layer 550 over the grid structure 540 and the dielectric fill layer 538 in each sensor chip 502, in accordance with some embodiments.

Referring to FIG. 28, the buffer layer 550 is over the metal grids 542 and the dielectric fill layer 538 such that a top surface of the buffer layer 550 is above the top surfaces of the metal grids 542. The buffer layer 550 fills the cavities 544 between the metal grids 542. In some embodiments, the buffer layer 550 includes a dielectric oxide such as, for example, silicon dioxide. In some embodiments, the buffer layer 550 is deposited by PECVD. After deposition, in some embodiments, a planarization process such as CMP is performed on the buffer layer 550 to provide a planarized surface.

Figure 29:
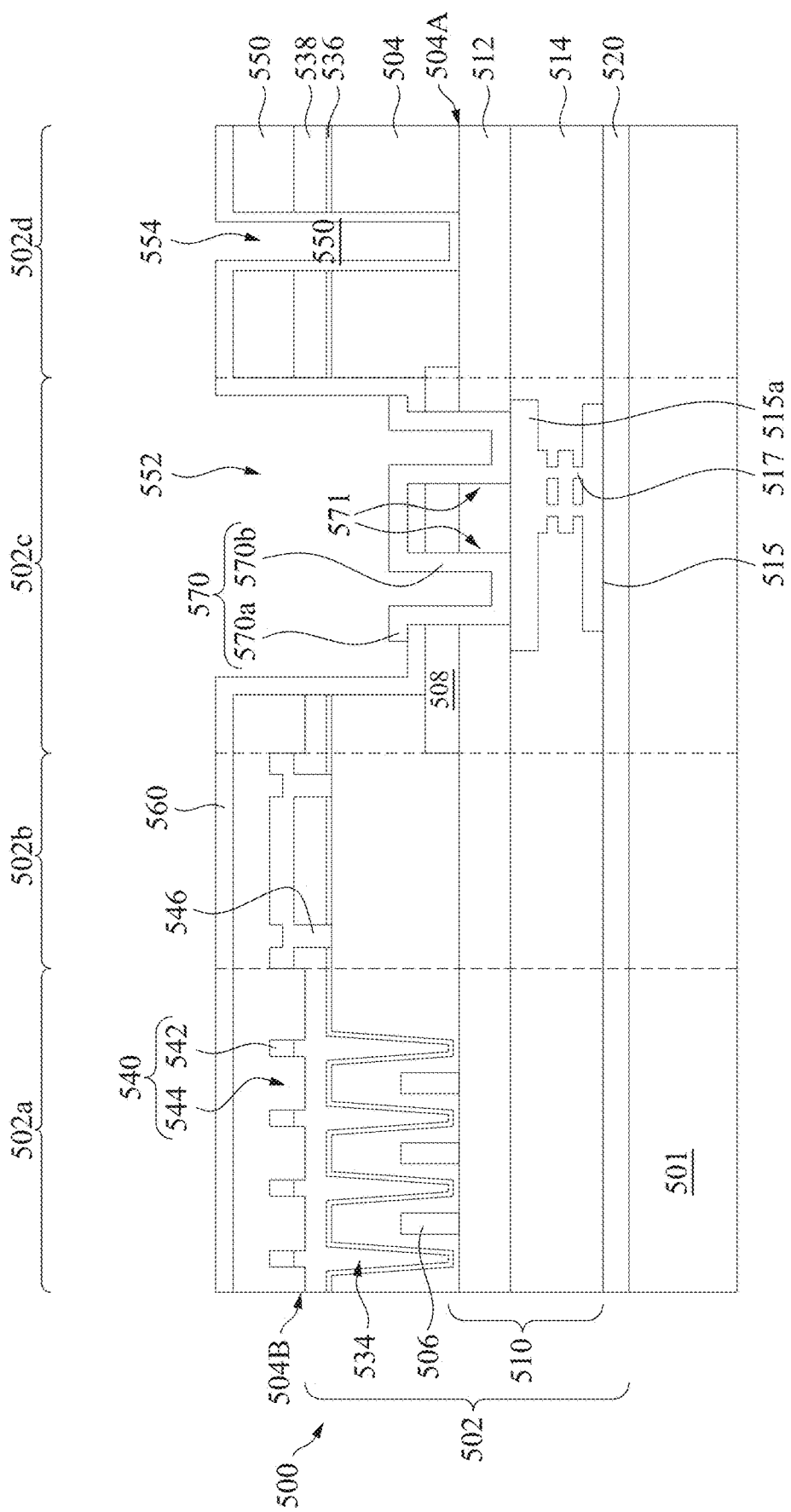

Referring to FIGS. 23 and 29, the method 2300 proceeds to operation 2312, in which a plurality of pad openings 552 and a trench 554 are formed in respective bonding pad region 502c and periphery region 502d, followed by forming a plurality of bonding pads 570 within respective pad openings 552. FIG. 29 is a cross-sectional view of the semiconductor structure of FIG. 28 after forming the plurality of pad openings 552 and the trench 554 in respective bonding pad region 502c and periphery region 502d, and forming the plurality of bonding pads 570 within respective pad openings 552, in accordance with some embodiments.

Referring to FIG. 29, each pad opening 552 in the bonding pad region 502c extends through the buffer layer 550, the trench fill layer 538, the dielectric liner layer 536, and the substrate 504 to expose the STI structure 508 in the bonding pad region 502c.

The trench 554 in the periphery region 502d extends through the buffer layer 550, the trench fill layer 538, the dielectric liner layer 536, and the substrate 504 to expose a portion of the ILD layer 512, in some embodiments. In some embodiments, the trench 554 has a continuous structure that completely surrounds the active circuit region of each sensor chip 502 including the pixel array region 502a, the logic region 502b, and the bonding pad region 502c. In some embodiments, the trench 554 includes multiple trench segments that are arranged along the perimeter of the active circuit region (502a, 502b and 502c) and together completely surround the active circuit region (502a, 502b and 502c) of each sensor chip 502. In some embodiments, a distance between opposite ends of adjacent trench segments is less than about 100 µm. If the distance between opposite ends of adjacent trench segments is too great, a stress relieving aspect of the trench segments is reduced in some instances.

The pad openings 552 and trench 554 are formed by lithography and etching processes. In some embodiments, a photoresist layer (not shown) is first applied over the buffer layer 550 for example, by spin coating. The photoresist layer is then patterned using a photolithography process that involves exposure, baking, and developing of the photoresist to form a patterned photoresist layer having openings therein. The openings expose areas of the substrate 504 where the pad openings 552 and trench 554 are subsequently formed. The openings in the patterned photoresist layer are then transferred into the buffer layer 550, the dielectric fill layer 538, the dielectric liner layer 536, and the substrate 504 to form the pad openings 552 and trench 554 by at least one anisotropic etch. In some embodiments, the at least one anisotropic etch includes a dry etch such as, for example, RIE or a plasma etch, a wet etch, or combinations thereof. In some embodiments, the buffer layer 550, the dielectric fill layer 538, the dielectric liner layer 536, and the substrate 504 are etched by a single anisotropic etch. In some embodiments, the buffer layer 550, the dielectric fill layer 538, the dielectric liner layer 536, and the substrate 504 are etched by multiple anisotropic etches. After formation of the pad openings 552 and trench 554, the patterned photoresist layer is removed, for example, by wet stripping or plasma ashing. In some embodiments, the lithography and etching processes employed in formation of pad openings 552 and trench 554 also form scribe lines in the substrate 504 between adjacent sensor chips 502. In some embodiments, pad openings 552 and trench 554 are formed simultaneously. In some embodiments, pad openings 552 and trench 554 are formed sequentially.

In some embodiments, a cross-section of at least one of the pad openings 552 and the trench 554 is formed to have a rectangular shape with substantially vertical side walls. In other embodiments, a cross-section of at least one of the pad openings 552 and the trench 554 is formed to have a trapezoid shape with inclined sidewalls. In some embodiments, at least one of the pad openings 552 and the trench 554 is formed to have a width decreasing as the distance from the buffer layer 550 increases. In some embodiments, the difference between a width of the trench 554 at the top and a width of the trench 554 at the bottom is from about 0.01 µm to about 10 µm. The difference in width of the trench 554 helps with subsequent deposition into the trench 554 without closing an opening at the top of the trench 554.

After formation of the pad openings and the trench 554, a passivation layer 560 is deposited along sidewalls and bottom surfaces of the pad openings 552 and trench 554 of each sensor chip 502 and over the buffer layer 550. In some embodiments, the passivation layer 560 includes a dielectric oxide such as, for example, silicon dioxide. In some embodiments, the passivation layer 560 is deposited by a conformal deposition process such as, for example, CVD or ALD. The passivation layer 560 along the sidewalls and bottom surface of the trench 554 partially fills the trench 554, leaving an air gap 555 in the trench 554.

The air gap-containing trench 554 is void of semiconductor material of the substrate 404, and is able to help to release stress in the wafer stack. The air gap-containing trench 554 thus functions as a stress-releasing structure, helping to prevent the cracks produced during the die cut process from propagating into the active circuit region (502a, 502b, 502c) of each sensor chip 502. Introducing air gap-containing trench 554 in the periphery region 50d of each sensor chip 502 thus helps to improve the reliability of the sensor chip 502.

A bonding pad 570 is subsequently formed within each pad opening 552. The bonding pad 570 extends through passivation layer 560, the STI structure 508, and the ILD layer 512 to electrically couple to a metal line 515a in the interconnect structure 510. In some embodiments, the metal line 515a is a closest metal line to the substrate 504. In other embodiments, the metal line 515a is separated from the substrate 504 by one or more conductive wires (not shown). In some embodiments, the bonding pad 570 has a slotted structure including base portions 570a overlying a portion of the passivation layer 560 at the bottom of the pad opening 552 and protrusions 570b along sidewalls and bottoms surfaces of openings 571 extending through the passivation layer 560, the STI structure 508, and the ILD 512. The bonding pad 570 includes a conductive material such as, for example, aluminum, copper, tungsten, alloy thereof, or combinations thereof.

The bonding pad 570 formed by first etching the passivation layer 560, the STI structure 508, and the ILD layer 512 to form openings 571, exposing the metal line 515a. In some embodiments, the openings 571 is formed using lithography and etching processes including applying a photoresist layer to the passivation layer 560, patterning the photoresist layer, etching the passivation layer 560, the STI structure 508, and the ILD layer 512 using the patterned photoresist layer as a mask, and then stripping the patterned photoresist layer. After forming the openings, a pad metal layer is formed along sidewall and bottom surfaces of openings 571 and over the passivation layer 560. In some embodiments, the pad metal layer is formed using a conformal deposition process such as, for example, CVD, PVD, or plating. The pad metal layer is then etched to form the bonding pad 570 within each pad opening 552. Sidewalls of the bonding pad 570 are away from the sidewalls of the pad opening 552.

Figure 30:
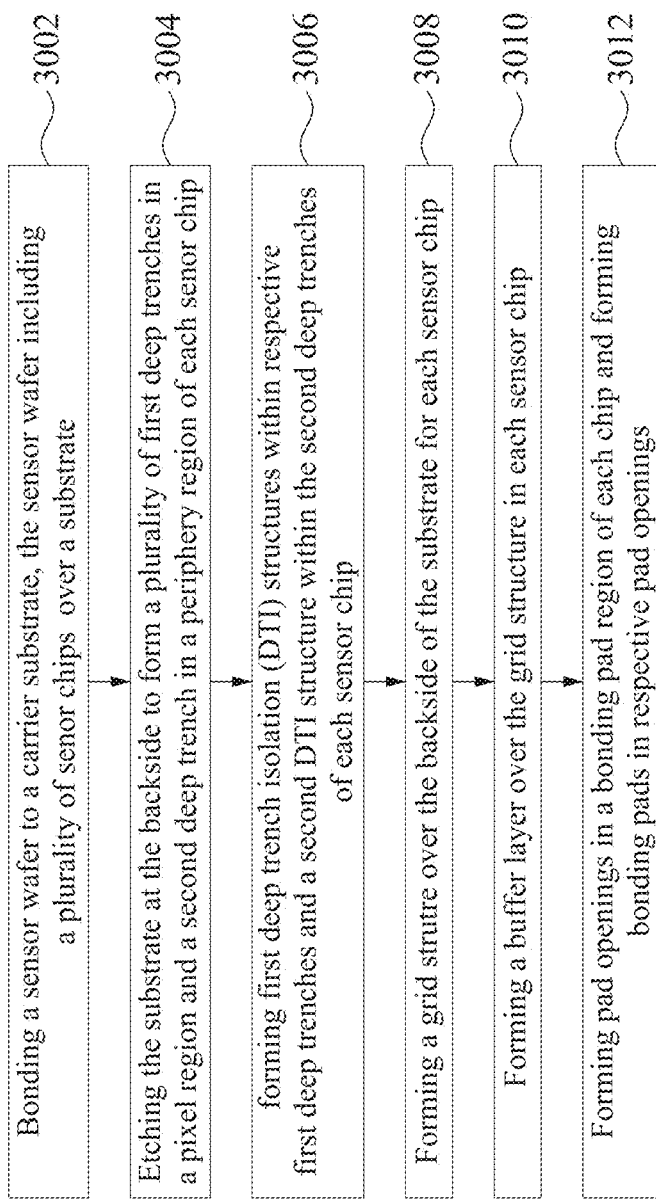
FIG. 30 is a flowchart of a method for fabricating a sensor chip having stress-releasing trench structures, in accordance with some embodiments.

FIG. 30 is a flow chart of a method 3000 for fabricating an image sensor device, e.g., image sensor device 100 having stress-releasing trench structures, e.g., stress-releasing trench structures 130, in accordance with some embodiments. In comparison with the method 2300 in which the trenches for formation of stress-releasing trench structures are formed at the pad opening stage, in the method 3000, the trenches for formation of stress-releasing trench structures are formed at the deep trench etching stage.

FIGS. 31-35 are cross-section views of intermediate stages in the formation of the image sensor device 100, in accordance with some embodiments. Unless specified otherwise, the materials and the formation methods of the components in these embodiments are essentially the same as their like components, which are denoted by like reference numerals in the embodiments shown in FIGS. 24-29. The details regarding the formation processes and the materials of the components shown in FIGS. 31-35 are thus found in the discussion of the embodiments shown in FIGS. 24-29.

Referring to FIGS. 30, the method 3000 includes operation 3002, in which a sensor wafer 500 is bonded to a carrier substrate 501 to form a wafer stack. The sensor wafer 500 and the carrier substrate 501 in some embodiments have structures and compositions similar to those in FIG. 24, and hence are not discussed in detail.

Figure 31:
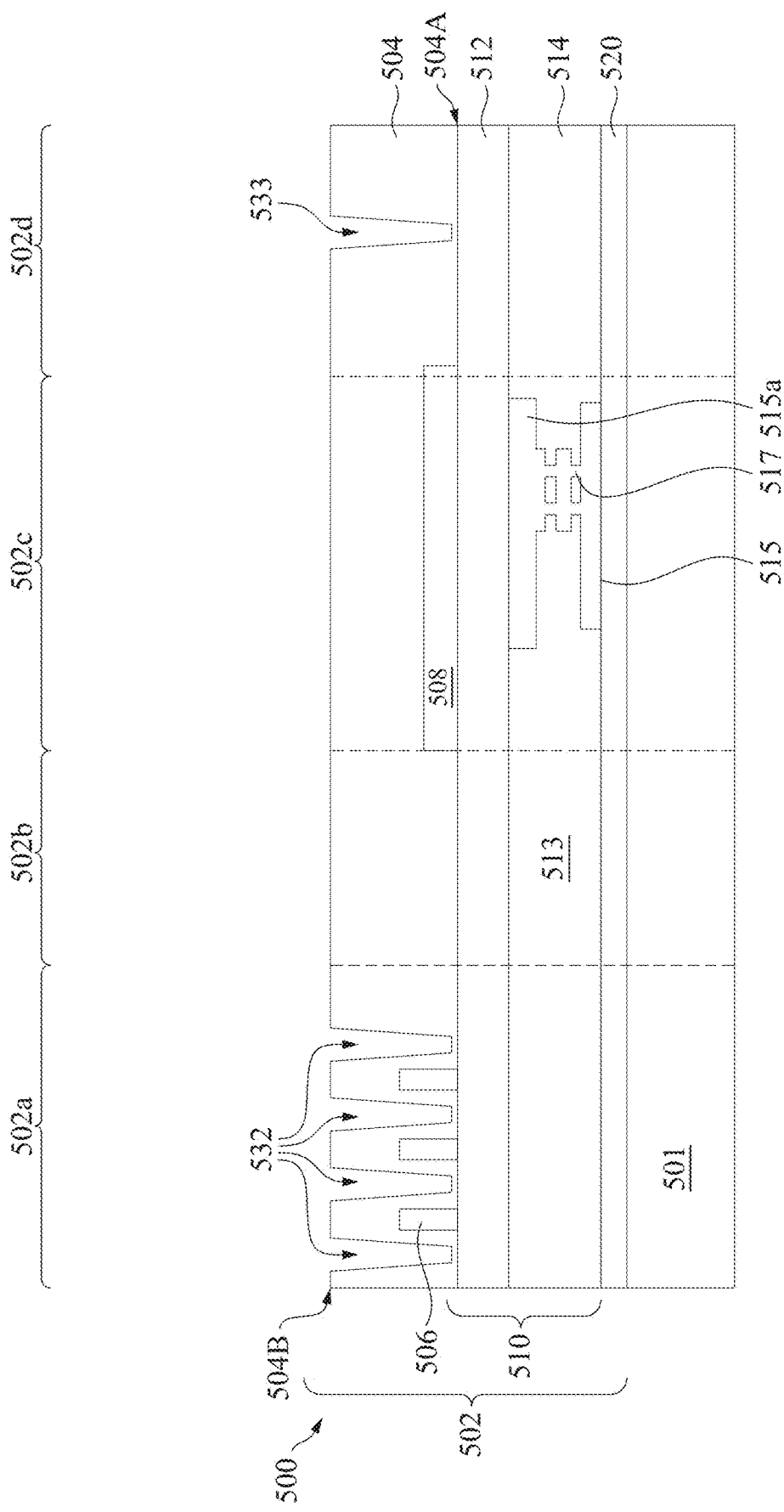
FIGS. 31-35 are cross-sectional views of a portion of a sensor chip having stress-releasing trench structures at various stages of fabrication, in accordance with some embodiments.

Referring to FIGS. 30 and 31, the method 3000 proceeds to operation 3004, in which the substrate 504 is etched at the back side 504B to form a plurality of first deep trenches 532 in the pixel array region 502a and a second deep trench 533 in the periphery region 502d of each sensor chip 502. FIG. 31 is a cross-sectional view of the semiconductor structure of FIG. 24 after etching the substrate 504 at the back side 504B to form the plurality of first deep trenches 532 in the pixel array region 502a and the second deep trench 533 in the periphery region 502d of each sensor chip 502, in accordance with some embodiments.

Figure 32:
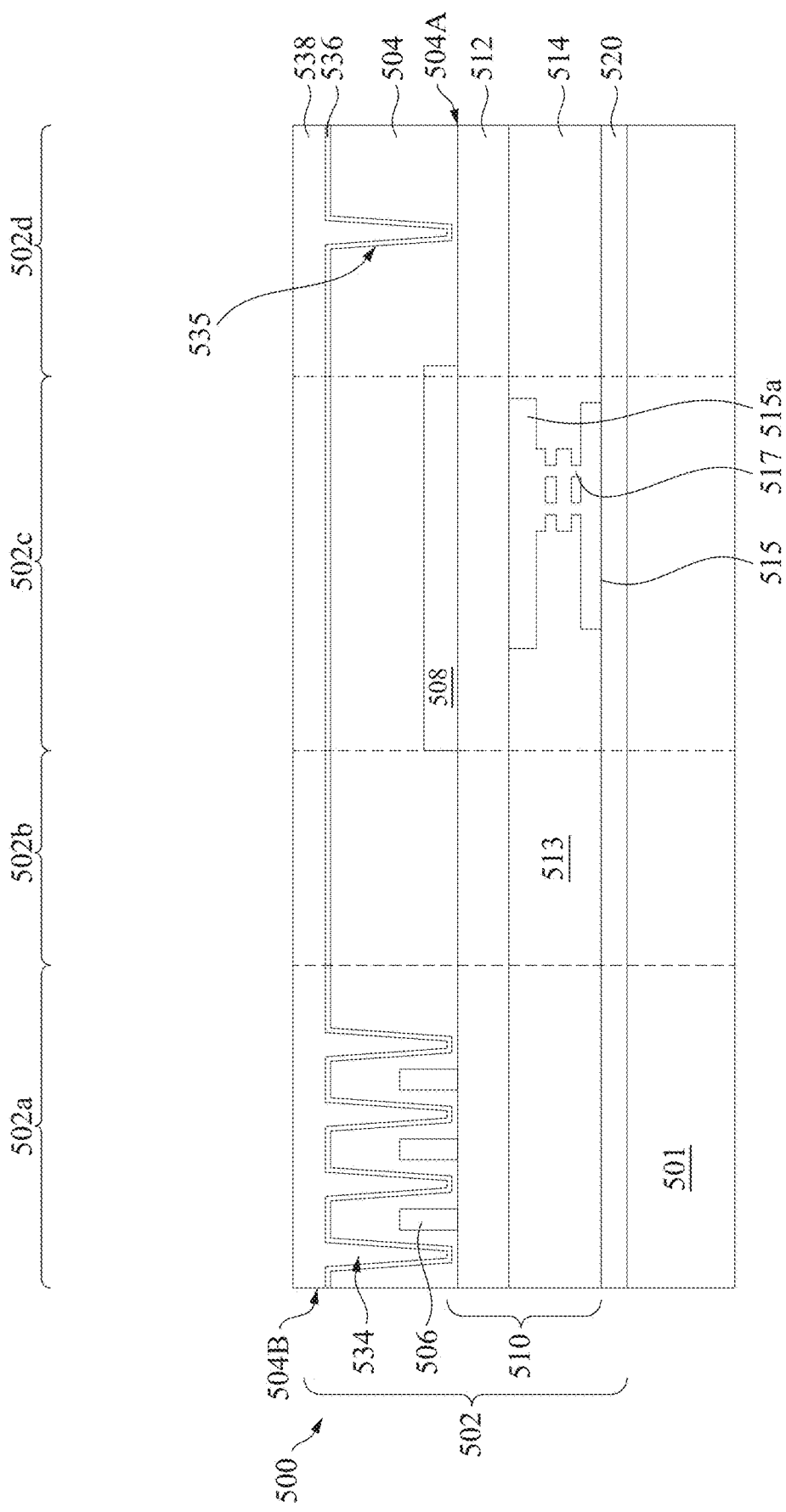

In FIG. 32, the first and second deep trenches 532 and 533 are formed to extend through the entire thickness of the substrate 404. In some embodiments, first and second deep trenches 532 and 533 are formed simultaneously. In some embodiments, first and second deep trenches 532 and 533 are formed sequentially. In some embodiments, the first and second deep trenches 532 and 533 expose portions of the ILD layer 512. In some embodiments, the first and second deep trenches 532 and 533 expose respective STI structures 508 if STI structures 508 are present at the front side 504A of the substrate 504 in the pixel array region 502a and the periphery region 502d. The first deep trenches 532 extend into regions between photosensitive elements 506 to separate adjacent photosensitive elements 506. The second deep trench 533 extends around a perimeter of each sensor chip 502. In some embodiments, the second deep trench 533 has a continuous structure that completely surrounds the active circuit region (502a, 502b, 502c) of each sensor chip 502. In some embodiments, the second deep trench 533 includes multiple trench segments that are arranged along the perimeter of the active circuit region (502a, 502b, 502c) and together completely surround the active circuit region (502a, 502b, 502c) of each sensor chip 502. In some embodiments, a distance between opposite ends of adjacent trench segments is less than about 100 μm. The formation processes for deep trenches 532 and 533 are similar to those described above with respect to formation of deep trenches 532 in FIG. 25, and hence are not described in detail.

Referring to FIGS. 30 and 32, the method 3000 proceeds to operation 3006, in which a plurality of first DTI structures 534 is formed in respective first deep trenches 532 and a second DTI structure 535 is formed in the second deep trench 533 of each sensor chip 502. FIG. 32 is a cross-sectional view of the semiconductor structure of FIG. 31 after forming the plurality of first DTI structures 534 in respective first deep trenches 532 and forming the second DTI structure 535 in the second deep trench 533 of each sensor chip 502, in accordance with some embodiments.

Figure 33:
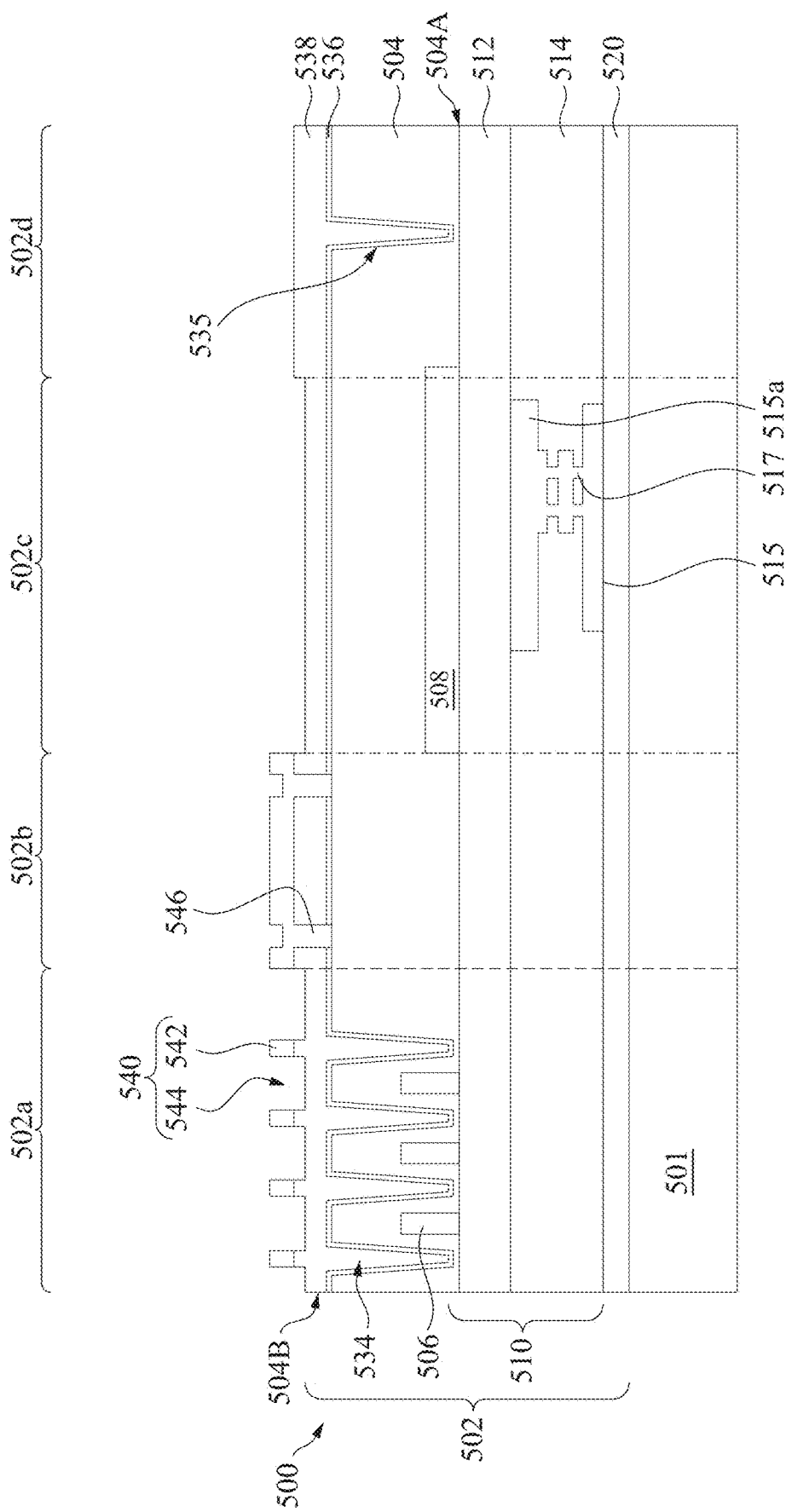

The first and second DTI structures 534 and 535 are formed by depositing a dielectric liner layer 536 along sidewalls and bottom surfaces of the first deep trenches 532 and the second deep trench 533 and over the back side surface of the substrate 504 followed by depositing a dielectric fill layer 538 over the dielectric liner layer 436 to fill the remaining volumes of the first and second deep trenches 532 and 533. A portion of the dielectric liner layer 536 and a portion of the dielectric fill layer 538 within each first deep trench 532 constitute a corresponding first DTI structure 534 in the pixel array region 502a of each sensor chip 502. The first DTI structures 534 separate adjacent photosensitive elements 506 from one another, thereby helping to reduce crosstalk between adjacent photosensitive elements 506. A portion of the dielectric liner layer 536 and a portion of the dielectric fill layer 538 within the second deep trench 533 constitute the second DTI structure 535 in the periphery region 502d of each sensor chip 502. In FIG. 33, the first DTI structures 534 and the second DTI structure 535 extend through the entire thickness of the substrate 504. The compositions of DTI structures 534 and 535 and formation processes for DTI structures 534 and 535 are similar to those described above with respect to DTI structures 534 in FIG. 26, and hence are not described in detail.

The second DTI structure 535 in the periphery region 502d of each sensor chip 502 contains dielectric materials different from the semiconductor material of the substrate 504, and is able to help to release stress in the wafer stack. The DTI structure 535 thus functions as a stress-releasing structure, helping to prevent the cracks produced during the die cut process from propagating into the active circuit region (502a, 502b, 502c) of each sensor chip 502. Introducing DTI structure 535 in the periphery region 502d of each sensor chip 502 thus helps to improve the reliability of the sensor chip 502.

Referring to FIGS. 30 and 33, the method 3000 proceeds to operation 3008, in which a grid structure 540 is formed over the back side 504B of the substrate 504. FIG. 33 is a cross-sectional view of the semiconductor structure of FIG. 32 after forming a grid structure 540 over the back side 504B of the substrate 504, in accordance with some embodiments. The grid structure 540 is over the dielectric fill layer 538 and includes a plurality of metal grids 542 and a plurality of cavities 544 separating the metal grids 542 from one another. The compositions and the formation process for grid structure 540 is similar to those described above with respect to grid structure 540 in FIG. 27 and hence are not described in detail.

Figure 34:
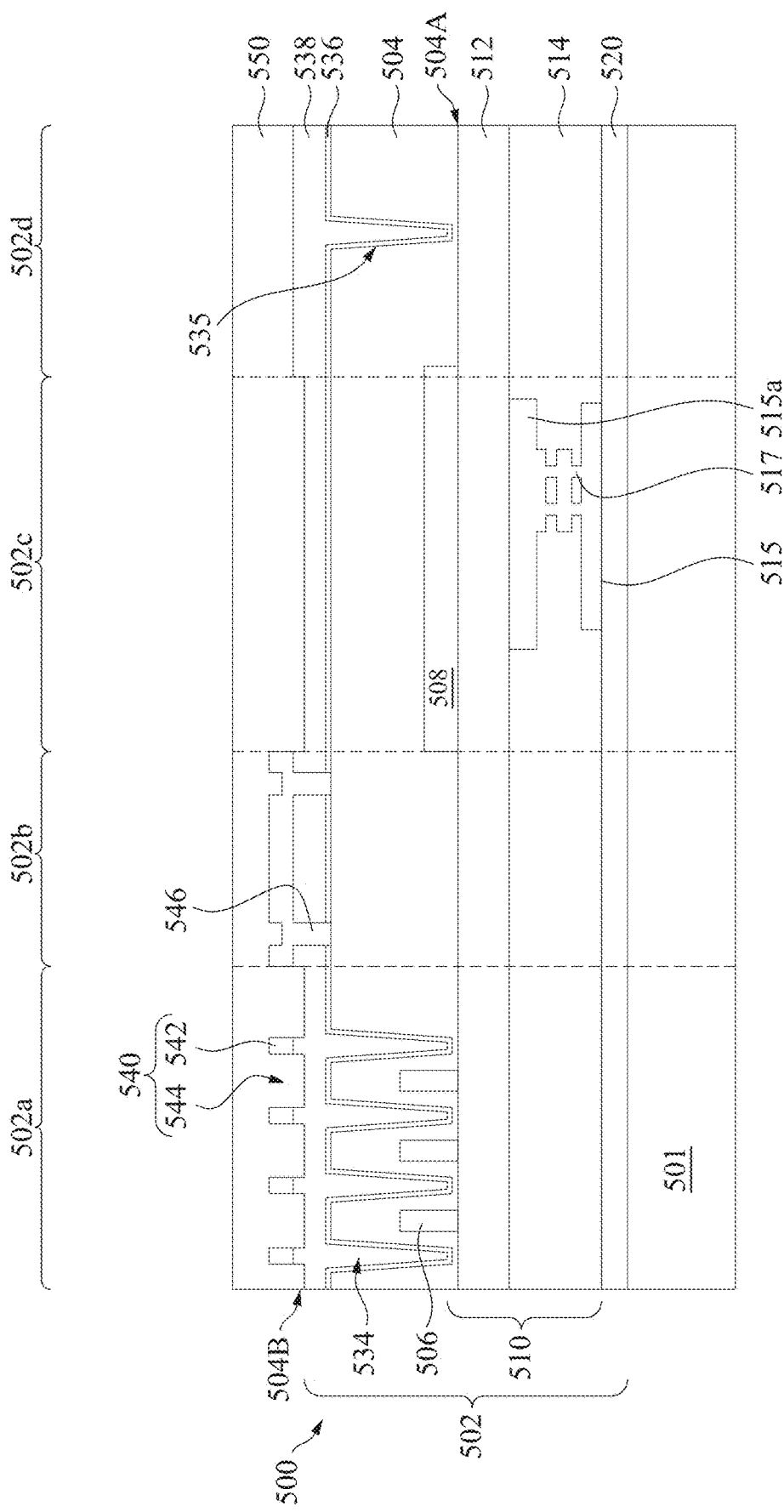

Referring to FIGS. 30 and 34, the method 3000 proceeds to operation 3010, in which a buffer layer 550 is formed over the grid structure 540 and the dielectric fill layer 538. FIG. 34 is a cross-sectional view of the semiconductor structure of FIG. 33 after forming the buffer layer 550 over the grid structure 540 and the dielectric fill layer 538, in accordance with some embodiments. The buffer layer 550 covers the second DTI structure 535 in the periphery region 502d of each sensor chip 502. The composition of the buffer layer 550 and formation processes for buffer layer 550 are similar to those described above with respect to buffer layer 550 in FIG. 28, and hence are not described in detail.

Figure 35:
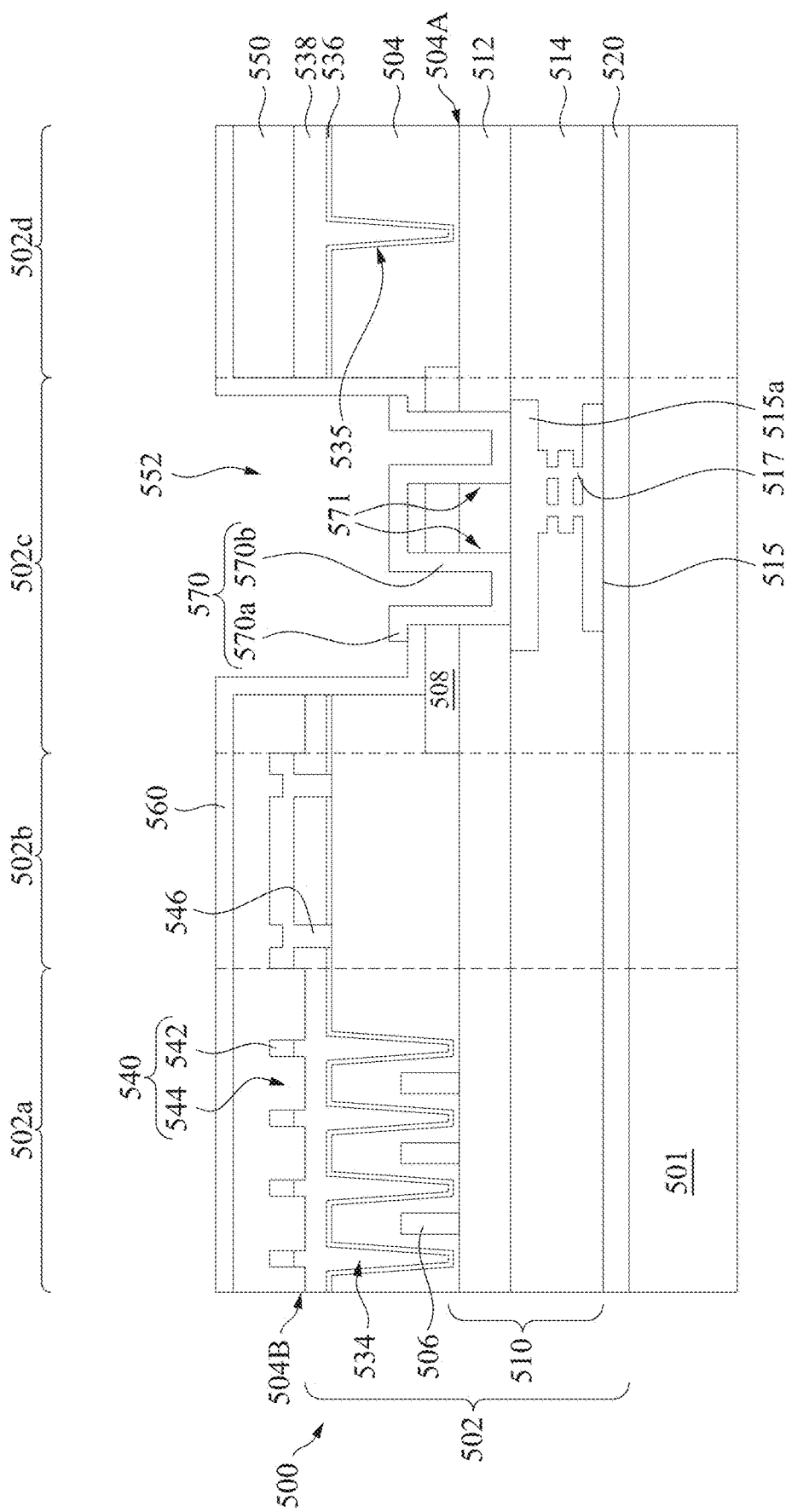

Referring to FIGS. 30 and 35, the method 3000 proceeds to operation 3012, in which a plurality of bonding pads 570 is formed within respective pad openings 552 in the bonding pad region 502c of each sensor chip 502. FIG. 35 is a cross-sectional view of the semiconductor structure of FIG. 34 after forming the plurality of bonding pads 570 within respective pad openings 552 in the bonding pad region 502c of each sensor chip 502, in accordance with some embodiments. The structures of bonding pads 570 and formation processes for bonding pads 570 are similar to those described above with respect to bonding pads 570 in FIG. 29 and hence are not described in detail.

An aspect of this description relates to a method of making a semiconductor structure. The method includes forming a pixel array region on a substrate. The method further includes forming a first seal ring region on the substrate, wherein the first seal ring region surrounds the pixel array region, and the first seal ring region includes a first seal ring. The method further includes forming a first isolation feature in the first seal ring region, wherein forming the first isolation feature includes filling a first opening with a dielectric material, wherein the first isolation feature is a continuous structure surrounding the pixel array region. The method further includes forming a second isolation feature between the first isolation feature and the pixel array region, wherein forming the second isolation feature includes filling a second opening with the dielectric material. In some embodiments, forming the first isolation feature includes forming the first isolation feature above the first seal ring. In some embodiments, the method further includes forming a dielectric layer over the first seal ring, wherein forming the first isolation feature includes forming the first isolation feature over the first seal ring. In some embodiments, filling the first opening includes filling the first opening with an oxide material. In some embodiments, forming the second isolation feature includes forming the second opening, wherein the second opening is wider than the first opening. In some embodiments, forming the pixel array region includes forming a plurality of pixels. In some embodiments, forming the pixel array region includes forming a plurality of deep trench isolation (DTI) features in the pixel array region. In some embodiments, the method further includes forming an interconnect structure, wherein the forming the pixel array region includes forming the pixel array region over the interconnect structure, and forming the first isolation feature includes forming the first isolation feature over the interconnect structure. In some embodiments, forming the second isolation feature includes filling the second opening simultaneously with filling the first opening.

An aspect of this description relates to a method of forming a semiconductor structure. The method includes forming a plurality of photosensitive elements in a semiconductor substrate. The method further includes forming a plurality of shallow trench isolation (STI) structures in the semiconductor substrate. The method further includes forming a plurality of pad openings in the semiconductor substrate, wherein the plurality of pad openings exposes a first STI structure of the plurality of STI structures. The method further includes forming a trench in the semiconductor substrate, wherein the trench exposes a second STI structure of the plurality of STI structures, and the trench completely surrounds the plurality of photosensitive elements. The method further includes depositing a passivation layer along sidewalls and bottom surfaces of the plurality of pad openings and the trench. In some embodiments, depositing the passivation layer includes depositing a continuous passivation layer. In some embodiments, the method further includes forming a bonding pad in a first pad opening of the plurality of pad openings. In some embodiments, forming the bonding pad includes etching an opening through the first STI structure. In some embodiments, the method further includes depositing a dielectric material over the passivation layer in trench and the plurality of pad openings. In some embodiments, forming the plurality of pad openings includes forming the plurality of pad openings between the plurality of photosensitive elements and the trench.

An aspect of this description relates to a method of forming a semiconductor structure. The method includes forming a plurality of photosensitive elements in a semiconductor substrate. The method further includes forming a plurality of shallow trench isolation (STI) structures in the semiconductor substrate. The method further includes forming a plurality of pad openings in the semiconductor substrate, wherein the plurality of pad openings exposes a first STI structure of the plurality of STI structures. The method further includes forming a trench in a seal ring region of the semiconductor substrate, wherein the trench exposes a second STI structure of the plurality of STI structures, and the trench completely surrounds the plurality of photosensitive elements, wherein the plurality of pad openings are between the trench and the plurality of photosensitive elements. In some embodiments, the method further includes forming an interconnect structure on a surface of the semiconductor substrate opposite to the plurality of pad openings. In some embodiments, forming the trench includes forming a continuous trench surrounding the plurality of photosensitive elements. In some embodiments, forming the trench includes forming a plurality of discontinuous trenches surrounding the plurality of photosensitive elements. In some embodiments, the method further includes depositing a dielectric fill material in the plurality of pad openings.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of making a semiconductor structure, the method comprising:
    forming a pixel array region on a substrate;
    forming a first seal ring region on the substrate, wherein the first seal ring region surrounds the pixel array region, and the first seal ring region comprises a first seal ring;
    forming a first isolation feature in the first seal ring region, wherein forming the first isolation feature comprises filling a first opening with a dielectric material, wherein the first isolation feature is a continuous structure surrounding the pixel array region; and
    forming a second isolation feature between the first isolation feature and the pixel array region, wherein forming the second isolation feature comprises filling a second opening with the dielectric material.

2. The method of claim 1, wherein forming the first isolation feature comprises forming the first isolation feature above the first seal ring.

3. The method of claim 1, further comprising forming a dielectric layer over the first seal ring, wherein forming the first isolation feature comprises forming the first isolation feature over the first seal ring.

4. The method of claim 1, wherein filling the first opening comprises filling the first opening with an oxide material.

5. The method of claim 1, wherein forming the second isolation feature comprises forming the second opening, wherein the second opening is wider than the first opening.

6. The method of claim 1, wherein forming the pixel array region comprises forming a plurality of pixels.

7. The method of claim 1, wherein forming the pixel array region comprises forming a plurality of deep trench isolation (DTI) features in the pixel array region.

8. The method of claim 1, further comprising forming an interconnect structure, wherein the forming the pixel array region comprises forming the pixel array region over the interconnect structure, and forming the first isolation feature comprises forming the first isolation feature over the interconnect structure.

9. The method of claim 1, wherein forming the second isolation feature comprises filling the second opening simultaneously with filling the first opening.

10. A method of forming a semiconductor structure comprising:
    forming a plurality of photosensitive elements in a semiconductor substrate;
    forming a seal ring region surrounding the plurality of pixel elements;
    forming a plurality of shallow trench isolation (STI) structures in the semiconductor substrate;
    forming a plurality of pad openings in the semiconductor substrate, wherein the plurality of pad openings exposes a first STI structure of the plurality of STI structures;
    forming a trench in the semiconductor substrate, wherein the trench exposes a second STI structure of the plurality of STI structures, and the trench completely surrounds the plurality of photosensitive elements; and
    depositing a passivation layer along sidewalls and bottom surfaces of the plurality of pad openings and the trench.

11. The method of claim 10, wherein depositing the passivation layer comprises depositing a continuous passivation layer.

12. The method of claim 10, further comprising forming a bonding pad in a first pad opening of the plurality of pad openings.

13. The method of claim 12, wherein forming the bonding pad comprises etching an opening through the first STI structure.

14. The method of claim 10, further comprising depositing a dielectric material over the passivation layer in trench and the plurality of pad openings.

15. The method of claim 10, wherein forming the plurality of pad openings comprises forming the plurality of pad openings between the plurality of photosensitive elements and the trench.

16. A method of forming a semiconductor structure comprising:
    forming a plurality of photosensitive elements in a semiconductor substrate;
    forming a plurality of shallow trench isolation (STI) structures in the semiconductor substrate;
    forming a plurality of pad openings in the semiconductor substrate, wherein the plurality of pad openings exposes a first STI structure of the plurality of STI structures;
    forming a trench in a seal ring region of the semiconductor substrate, wherein the trench exposes a second STI structure of the plurality of STI structures, and the trench completely surrounds the plurality of photosensitive elements, wherein the plurality of pad openings are between the trench and the plurality of photosensitive elements.

17. The method of claim 16, further comprising forming an interconnect structure on a surface of the semiconductor substrate opposite to the plurality of pad openings.

18. The method of claim 16, wherein forming the trench comprises forming a continuous trench surrounding the plurality of photosensitive elements.

19. The method of claim 16, wherein forming the trench comprises forming a plurality of discontinuous trenches surrounding the plurality of photosensitive elements.

20. The method of claim 16, further comprising depositing a dielectric fill material in the plurality of pad openings.

* * * * *